US012776364B2

(12) United States Patent
Oh et al.

(10) Patent No.: US 12,776,364 B2
(45) Date of Patent: Oct. 27, 2026

(54) WRITE CLOCK BIAS GENERATOR CONFIGURED TO COMPENSATE FOR CHANGE OF THRESHOLD VOLTAGE OF TRANSISTOR ACCORDING TO CHANGE OF TEMPERATURE AND MEMORY DEVICE INCLUDING THE SAME

(71) Applicant: SAMSUNG ELECTRONICS CO., LTD., Suwon-si (KR)

(72) Inventors: Taeseob Oh, Suwon-si (KR); Jang Hoo Kim, Suwon-si (KR); Jinhyeok Baek, Suwon-si (KR); Jaewoo Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 70 days.

(21) Appl. No.: 18/946,420

(22) Filed: Nov. 13, 2024

(65) Prior Publication Data

US 2025/0279134 A1 Sep. 4, 2025

(30) Foreign Application Priority Data

Feb. 29, 2024 (KR) ........................ 10-2024-0030212

(51) Int. Cl.
*G11C 11/4074* (2006.01)
*G11C 11/4093* (2006.01)
*G11C 11/4096* (2006.01)

(52) U.S. Cl.
CPC ...... *G11C 11/4096* (2013.01); *G11C 11/4074* (2013.01); *G11C 11/4093* (2013.01)

(58) Field of Classification Search
CPC ............ G11C 11/4096; G11C 11/4074; G11C 11/4093
See application file for complete search history.

(56) References Cited

U.S. PATENT DOCUMENTS 6,975,099 B2 12/2005 Wu et al.
7,639,067 B1 12/2009 Perisetty
(Continued)

FOREIGN PATENT DOCUMENTS

CN 115951746 A 4/2023
KR 10-0900083 B1 6/2009
KR 10-2024-0048330 A 4/2024

*Primary Examiner* — Min Huang
(74) *Attorney, Agent, or Firm* — Sughrue Mion, PLLC

(57) ABSTRACT

There is provided a write clock bias generator for providing a write clock bias to a first buffer. The write clock bias generator includes a voltage regulator receiving a reference voltage and outputting a feedback voltage, a resistor string connected between a first node from which the feedback voltage is output and a second node, a multiplexer performing a switching operation on the resistor string and outputting the write clock bias, and a compensation circuit connected to the second node. The compensation circuit includes first and second strings. The first transistor includes a drain electrode and a gate electrode connected to the second node, and the second string includes a second transistor including a drain electrode connected to the second node and driven based on the feedback voltage and a third transistor including a drain electrode and a gate electrode connected to a source electrode of the second transistor.

20 Claims, 22 Drawing Sheets

(56) References Cited

U.S. PATENT DOCUMENTS

| | | | | |
|---|---|---|---|---|
| 8,305,066 | B2 * | 11/2012 | Lin | G05F 1/575 323/289 |
| 9,461,539 | B2 | 10/2016 | Chern et al. | |
| 9,984,747 | B2 * | 5/2018 | Ham | G11C 13/0069 |
| 10,133,287 | B2 | 11/2018 | Yang | |
| 11,086,345 | B2 * | 8/2021 | Lee | G05F 1/575 |
| 2020/0313614 | A1 * | 10/2020 | Sawada | H03B 5/04 |
| 2024/0119997 | A1 * | 4/2024 | Choi | G11C 11/4074 |

* cited by examiner

WRITE CLOCK BIAS GENERATOR CONFIGURED TO COMPENSATE FOR CHANGE OF THRESHOLD VOLTAGE OF TRANSISTOR ACCORDING TO CHANGE OF TEMPERATURE AND MEMORY DEVICE INCLUDING THE SAME

CROSS-REFERENCE TO RELATED APPLICATIONS

This application is based on and claims priority under 35 U.S.C. § 119 to Korean Patent Application No. 10-2024-0030212 filed on Feb. 29, 2024, in the Korean Intellectual Property Office, the disclosures of which are incorporated by reference herein in their entireties.

BACKGROUND

Embodiments of the disclosure described herein relate to an electronic circuit, and more particularly, relate to a write clock bias generator capable of compensating for a change of a threshold voltage of a transistor due to a change of a temperature and a memory device including the same.

With the recent trend of high-performance and high-capacity memory devices such as a dynamic random access memory (DRAM), an operating frequency of the memory device is increasing. In addition, to satisfy a low-power characteristic required for a mobile device, there is being adopted the standard in which the frequency of a clock signal CK for transmitting a command and an address to the memory device and the frequency of a write clock WCK necessary in a write operation are different from each other.

The above memory device includes a write clock (WCK) buffer for receiving the write clock WCK, and a WCK bias generator supplies a bias voltage to the WCK buffer. The WCK buffer includes elements such as a transistor, and the threshold voltage of the transistor varies depending on a change of a temperature. To solve the above issue, various techniques for compensating for the change of the threshold voltage according to the temperature change are adopted.

For example, calibration for locking the WCK bias is performed in the initialization of the memory device. The calibration is performed only in the initialization. That is, after the initialization, the calibration is not performed in a normal operation of the memory device. In addition, existing techniques for compensating for the WCK bias in real time after the initialization fail to track the change of the threshold voltage properly. Accordingly, to stably receive the write clock WCK such that the performance of the memory device is improved, it is important to compensate for the change of the threshold voltage according to the temperature change.

SUMMARY

Embodiments of the disclosure provide a write clock bias generator capable of compensating for a change of a threshold voltage of a transistor due to a change of a temperature and a memory device including the same.

According to an aspect of the disclosure, there is provided a write clock bias generator for providing a write clock bias to a first buffer, the write clock bias generator including: a voltage regulator configured to receive a reference voltage and to output a feedback voltage; a resistor string comprising a first end connected to a first node and a second end connected to a second node, the feedback voltage output at the first node; a multiplexer configured to perform a switching operation corresponding to the resistor string and output the write clock bias based on the switching operation; and a compensation circuit connected to the second node, the compensation circuit including: a first string comprising a first transistor including a first drain electrode and a first gate electrode, the first drain electrode and the first gate electrode being connected to the second node; and a second string comprising a second transistor including a second drain electrode connected to the second node, and a third transistor including a third drain electrode and a third gate electrode, the third drain electrode and the third gate electrode being connected to a second source electrode of the second transistor, the second transistor being driven based on the feedback voltage.

According to another aspect of the disclosure, there is provided a memory device including: a buffer die configured to communicate with a memory controller through a plurality of channels; and a plurality of core dies provided on the buffer die, each of the plurality of core dies comprising a memory cell array corresponding to at least one of the plurality of channels, wherein the buffer die includes: a command/address receiver configured to receive a command and an address based on a clock signal received from at least one of the plurality of channels; a write clock buffer configured to receive a write clock through at least one of the plurality of channels; and a write clock bias generator configured to provide a write clock bias to the write clock buffer, the write clock bias generator including: a voltage regulator configured to output a feedback voltage; a resistor string and a multiplexer configured to output the write clock bias based on the feedback voltage; a first string connected to the resistor string and including a first transistor; and a second string connected to the resistor string and including a second transistor driven based on the feedback voltage and a third transistor, wherein the first transistor and the third transistor are diode-connected transistors.

According to another aspect of the disclosure, there is provided a write clock bias generator including: a voltage regulator configured to receive a reference voltage and to output a feedback voltage; a voltage division circuit configured to output a write clock bias based on the feedback voltage, the write clock bias varying based on a temperature change; and a compensation circuit connected to the voltage division circuit, the compensation circuit including: a first string connected to the voltage division circuit and including a first transistor; and a second string connected to the voltage division circuit and including a second transistor driven based on the feedback voltage and a third transistor, wherein the first transistor and the third transistor are diode-connected transistors.

BRIEF DESCRIPTION OF DRAWINGS

The above and other objects and features of the disclosure will become apparent by describing in detail embodiments thereof with reference to the accompanying drawings.

DETAILED DESCRIPTION

Figure 1:
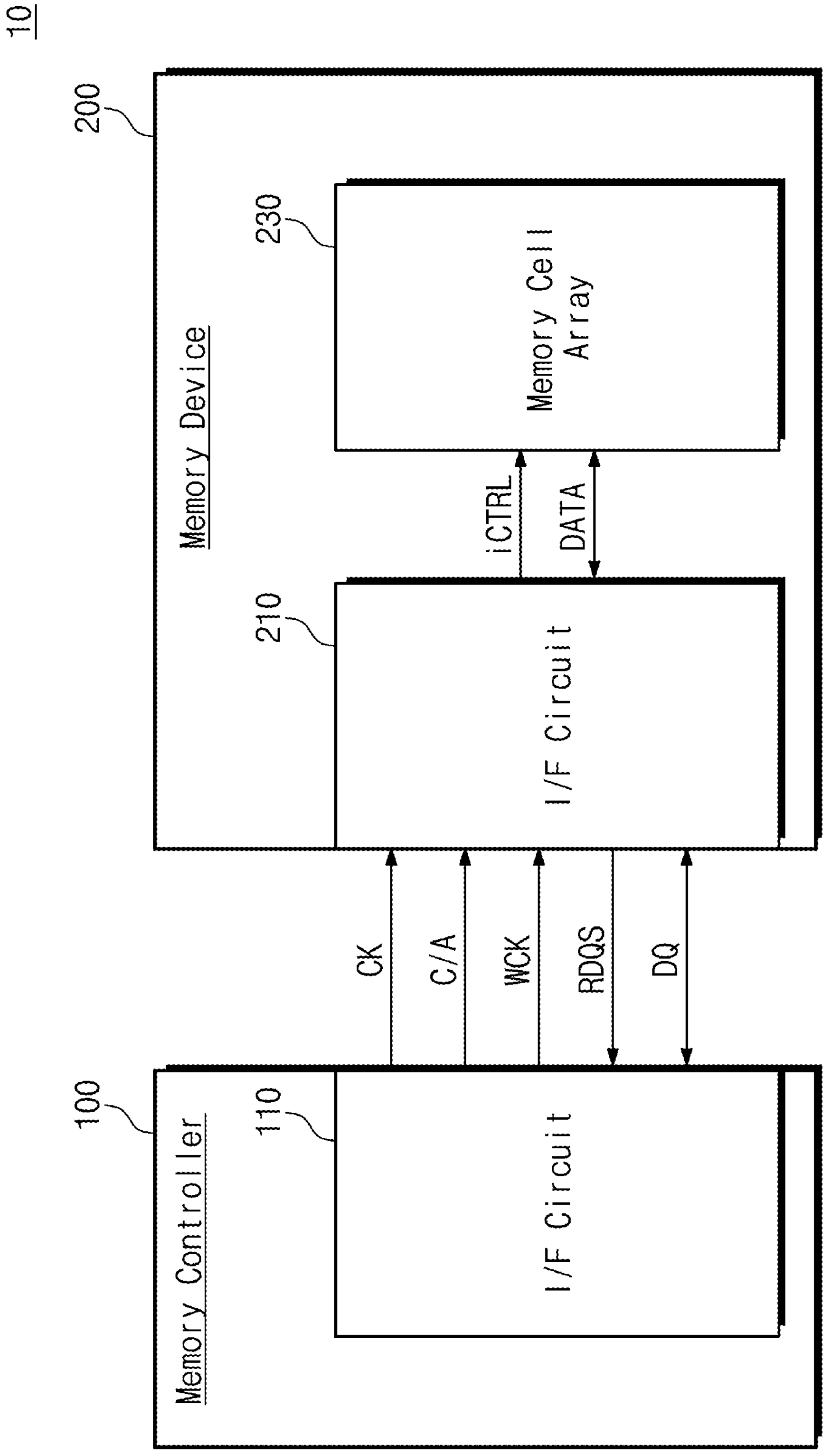
FIG. 1 is a block diagram illustrating a memory system according to an embodiment of the disclosure.

Below, embodiments of the disclosure will be described in detail and clearly to such an extent that an ordinary one in the art easily carries out the disclosure.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

For the purposes of interpreting this specification, the definitions (as defined herein) will apply and whenever appropriate the terms used in singular will also include the plural and vice versa. It is to be understood that the terminology used herein is for the purposes of describing particular embodiments only and is not intended to be limiting. The terms “comprising”, “having” and “including” are to be construed as open-ended terms unless otherwise noted.

The words/phrases “exemplary”, “example”, “illustration”, “in an instance”, “and the like”, “and so on”, “etc.”, “etcetera”, “e.g.,”, “i.e.,” are merely used herein to mean “serving as an example, instance, or illustration.” Any embodiment or implementation of the present subject matter described herein using the words/phrases “exemplary”, “example”, “illustration”, “in an instance”, “and the like”, “and so on”, “etc.”, “etcetera”, “e.g.,”, “i.e.,” is not necessarily to be construed as preferred or advantageous over other embodiments.

Embodiments herein may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by a firmware. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

It should be noted that elements in the drawings are illustrated for the purposes of this description and ease of understanding and may not have necessarily been drawn to scale. For example, the flowcharts/sequence diagrams illustrate the method in terms of the operations required for understanding of aspects of the embodiments of the disclosure. Furthermore, in terms of the construction of the device, one or more components of the device may have been represented in the drawings by conventional symbols, and the drawings may show only those specific details that are pertinent to understanding the present embodiments so as not to obscure the drawings with details that will be readily apparent to those of ordinary skill in the art having the benefit of the description herein. Furthermore, in terms of the system, one or more components/modules which include the system may have been represented in the drawings by conventional symbols, and the drawings may show only those specific details that are pertinent to understanding the present embodiments so as not to obscure the drawings with details that will be readily apparent to those of ordinary skill in the art having the benefit of the description herein.

The accompanying drawings are used to help easily understand various technical features and it should be understood that the embodiments presented herein are not limited by the accompanying drawings. As such, the disclosure should be construed to extend to any modifications, equivalents, and substitutes in addition to those which are particularly set out in the accompanying drawings and the corresponding description. Usage of words such as first, second, third etc., to describe components/elements/operations is for the purposes of this description and should not be construed as sequential ordering/placement/occurrence unless specified otherwise.

FIG. 1 is a block diagram illustrating a memory system according to an embodiment of the disclosure. Referring to FIG. 1, a memory system 10 may include a memory controller 100 and a memory device 200. The memory controller 100 may control one or more operations of the memory device 200. For example, the memory controller 100 may control all the operations of the memory device 200. For example, the memory controller 100 may control the memory device 200 to output data from the memory device 200 or store data in the memory device 200. For example, the memory controller 100 may be implemented as a part of a system on chip (SoC), but the disclosure is not limited thereto. As such, the memory controller 100 may be implemented in various other manner.

The memory controller 100 may include an interface (I/F) circuit 110. The memory controller 100 may transmit various signals to the memory device 200 through the interface circuit 110 and may receive various signals from the memory device 200 through the interface circuit 110. For example, as illustrated in FIG. 1, the memory controller 100 may transmit a clock signal CK, a command/address signal C/A, a write clock WCK, and a data signal DQ to the memory device 200. Also, the memory controller 100 may receive a read data strobe signal RDQS and the data signal DQ from the memory device 200. For example, one or more lines between the memory controller 100 and the memory device 200 may be bidirectional lines. For example, the data signal DQ may be a bidirectional line.

The memory device 200 may operate under control of the memory controller 100. For example, the memory device 200 may output the stored data under control of the memory controller 100 or may store the data provided from the memory controller 100.

The memory device 200 may include an interface circuit 210 and a memory cell array 230. The memory device 200 may transmit various signals to the memory controller 100 through the interface circuit 210 and may receive various signals from the memory controller 100 through the interface circuit 110. For example, the memory device 200 may transmit the read data strobe signal RDQS and the data signal DQ to the memory controller 100 through the interface circuit 210 and may receive the clock signal CK, the command/address signal C/A, the write clock WCK, and the data signal DQ from the memory controller 100 through the interface circuit 210. The interface circuit 210 may generate a control signals iCTRL based on a signal provided from the memory controller 100. For example, the control signals iCTRL may be internal signals generated in the memory device 200 for accessing the memory cell array 230. For example, based on the control signals iCTRL, the memory cell array 230 may store the data or may output the stored data.

The memory cell array 230 may include a plurality of memory cells. For example, the memory cell may be a dynamic random access memory (DRAM) cell. In this case, the interface circuit 110 and the interface circuit 210 may communicate with each other based on one of the standards such as double data rate (DDR), low power double data rate (LPDDR), graphics double data rate (GDDR), wide I/O, high bandwidth memory (HBM), hybrid memory cube (HMC), etc.

The interface circuit 110 may generate the clock signal CK and may transmit the clock signal CK to the memory device 200. The clock signal CK may be a differential signal. The clock signal CK may be a signal which toggles between the high level and the low level periodically. The interface circuit 110 may transmit the command/address signal C/A to the memory device 200 based on the toggle timings of the clock signal CK.

The interface circuit 110 may generate the write clock WCK and may transmit the write clock WCK to the memory device 200. The write clock WCK may be a differential signal. The interface circuit 110 may generate the write clock WCK which toggles between the high level and the low level periodically. The write clock WCK may be a clock for preforming the write operation and/or performing the read operation of the memory device 200. The interface circuit 110 may transmit the data signal DQ to the memory device 200 based on the toggle timings of the write clock WCK.

The interface circuit 110 may receive the read data strobe signal RDQS from the memory device 200. The read data strobe signal RDQS may be a differential signal. The interface circuit 110 may receive the data signal DQ from the memory device 200 and may latch the received data signal DQ based on timings of the toggle (may be referred to as "toggle timings") of the read data strobe signal RDQS. Accordingly, the interface circuit 110 may receive data "DATA" included in the data signal DQ.

The interface circuit 210 may receive the clock signal CK from the memory controller 100. The interface circuit 210 may receive the command/address signal C/A from the memory controller 100 and may latch the command/address signal C/A based on the toggle timings of the clock signal CK. For example, the toggle timings may include, but is not limited to, a rising edge of the clock signal CK and/or a falling edge of the clock signal CK. Thus, the interface circuit 210 may obtain a command or an address included in the command/address signal C/A.

Although FIG. 1 illustrates an example in which a command and an address are transmitted from the memory controller 100 to the memory device 200 by using the same input/output channel, the disclosure is not limited thereto. As such, according to another embodiment, the command and the address may be transmitted from the memory controller 100 to the memory device 200 by using different input/output channels.

The interface circuit 210 may receive the write clock WCK from the memory controller 100. The interface circuit 210 may receive the data signal DQ and may latch the data signal DQ based on the toggle timings of the write clock WCK. For example, the toggle timings may include, but is not limited to, a rising edge of the write clock WCK and/or a falling edge of the write clock WCK. Thus, the interface circuit 210 may obtain the data "DATA" included in the data signal DQ.

The interface circuit 210 may generate the read data strobe signal RDQS and may transmit the read data strobe signal RDQS to the memory controller 100. The read data strobe signal RDQS may be a differential signal. The interface circuit 210 may generate the read data strobe signal RDQS which toggles between the high level and the low level periodically during the read operation of the memory device 200. In an embodiment, the interface circuit 210 may generate the read data strobe signal RDQS based on the write clock WCK received from the memory controller 100. The interface circuit 210 may transmit the data signal DQ to the memory controller 100 based on the toggle timings of the read data strobe signal RDQS.

In an embodiment, the frequency of each of the write clock WCK and the read data strobe signal RDQS may be two times higher than the frequency of the clock signal CK. In an example case in which the data signal DQ is transferred based on the signals WCK and RDQS, the memory controller 100 and the memory device 200 may transmit/receive data at high speed.

Figure 2:
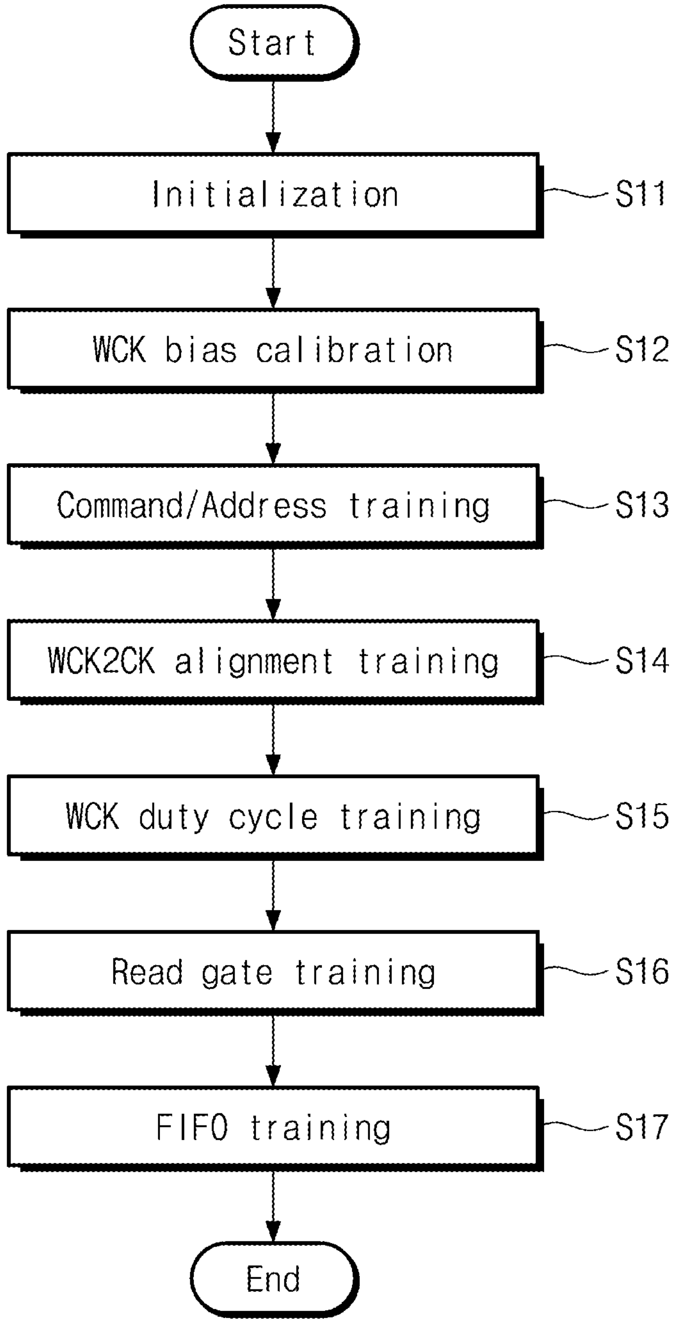
FIG. 2 is a flowchart illustrating an operating method of a memory system according to an embodiment of the disclosure.

FIG. 2 is a flowchart illustrating an operating method of a memory system according to an embodiment of the disclosure.

Referring to FIGS. 1 and 2, in operation S11, the method may include performing an initialization. For example, the memory system 10 may perform initialization. In an example case in which the memory system 10 is powered on, the memory controller 100 and the memory device 200 may perform the initialization in compliance with a given scheme. During the initialization, the memory controller 100 may provide a power supply voltage to the memory device 200, may perform various initial setup operations, and may read or set necessary information from or to the memory device 200.

In operation S12, the method may include performing write clock (WCK) bias calibration. For example, the memory system 10 may perform WCK bias calibration. In an embodiment, the WCK bias calibration may include provided a bias voltage to a buffer (hereinafter referred to as a "WCK buffer") of the interface circuit 210 to stably receive the write clock WCK from the memory controller 100. However, the disclosure is not limited thereto, and as such, WCK bias calibration may be performed in another manner. The interface circuit 210 of the disclosure may detect a change of a threshold voltage of a transistor of the WCK buffer due to a temperature change and may maintain a current of the WCK buffer uniformly. For example, the WCK buffer may constant current even in a case in which a change is detected in the threshold voltage of the transistor of the WCK buffer.

In operation S13, the method may include performing a command/address training. For example, the memory system 10 may perform a command/address training operation. For example, the memory controller 100 and the memory device 200 may perform the command/address training operation such that the command/address signal C/A is capable of being latched at a desired timing based on the clock signal CK.

In operation S14, the method may include performing a write clock-to-clock signal (WCK2CK) alignment training. For example, the memory system 10 may perform a write clock-to-clock signal (WCK2CK) alignment training operation. For example, the memory device 200 may receive the clock signal CK and the write clock WCK from the memory controller 100 and may adjust the timing to transmit the write clock WCK such that the clock signal CK and the write clock WCK are aligned. For example, the frequency of the write clock WCK may be "N" times the frequency (N being a natural number) of the clock signal CK.

In operation S15, the method may include performing a write clock (WCK) duty cycle training. For example, the memory system 10 may perform a write clock (WCK) duty cycle training operation. For example, the interface circuit 110 may perform duty cycle training using a duty cycle corrector (DDC) or a duty cycle adjuster (DCA). According to an embodiment, the WCK duty cycle training may include delaying the read data strobe signal RDQS received from the memory device 200. For example, the interface circuit 110 may delay the read data strobe signal RDQS received from the memory device 200. For example, the interface circuit 110 may delay the read data strobe signal RDQS by using a component such as gate logic.

In operation S16, the method may include performing a read gate training. For example, the memory system 10 may perform a read gate training operation. For example, the interface circuit 110 may determine when to observe a read DQ and the read data strobe signal RDQS and may control the timing to receive the read DQ and the read data strobe signal RDQS from the memory device 200. To this end, the memory controller 100 may include a component for controlling the timing to receive the read data strobe signal RDQS. The component may include, but is not limited to, a logic gate or a delay circuit.

In operation S17, the method may include performing FIFO training. For example, the memory system 10 may perform FIFO training operation. For example, due to a design (or a structure) of the memory device 200 and/or a design (or a structure) of a package including the memory controller 100 and the memory device 200, the delay of the data signal DQ may be different from the delay of the write clock WCK. The FIFO training may be for correcting the delay due to a path difference of the write clock WCK and the data signal DQ. The FIFO training may include read FIFO training and write FIFO training.

In an embodiment, in the read FIFO training, the memory controller 100 may control the timing to receive the read DQ and/or the read data strobe signal RDQS by delaying the read DQ and/or the read data strobe signal RDQS received from the memory device 200. In the write FIFO training, the memory controller 100 may control the timing to transmit the write DQ and the write clock WCK by delaying the write DQ to be transmitted to the memory device 200. After the FIFO training is completed, the memory system 10 may perform a normal operation.

Figure 3:
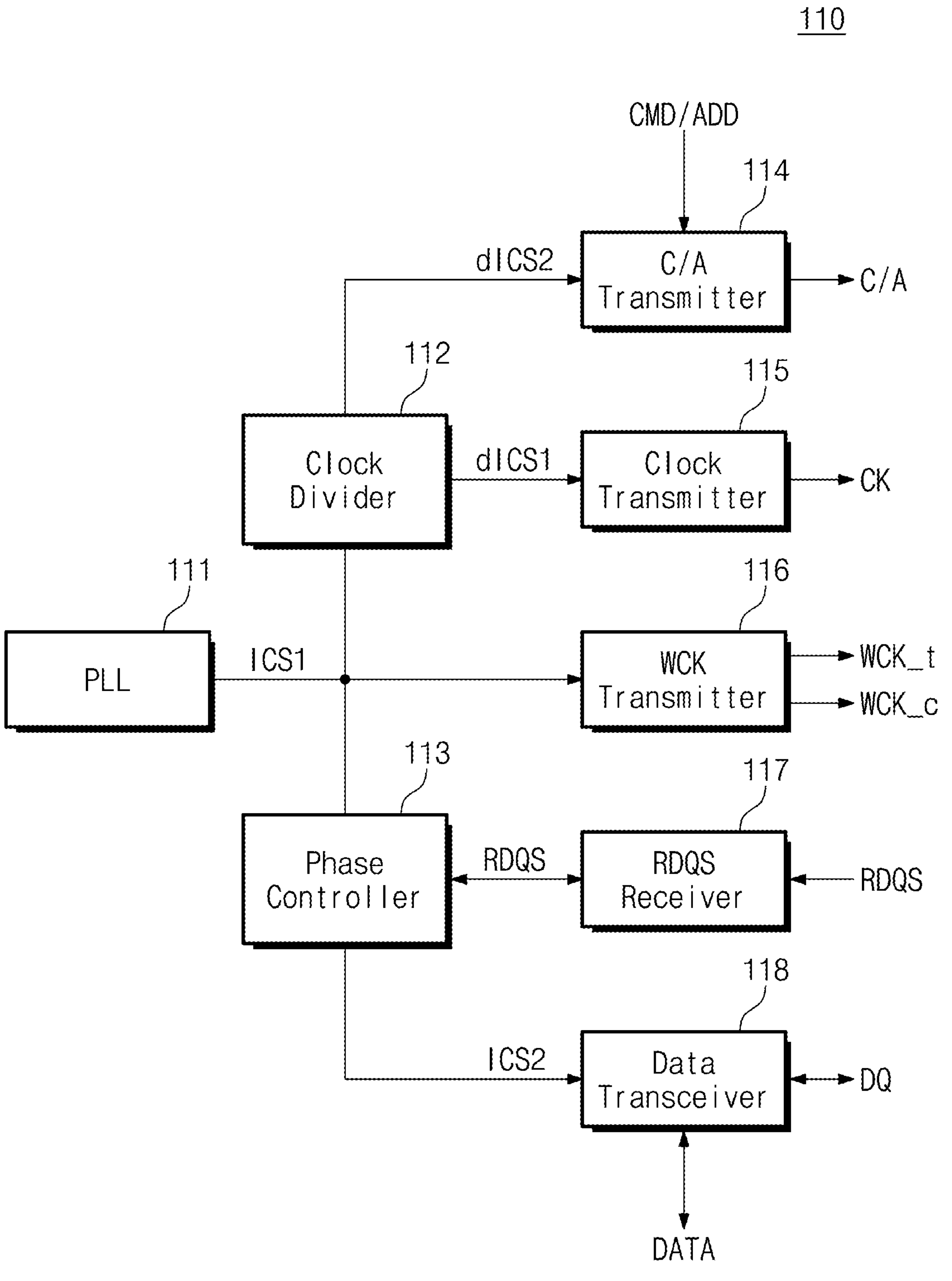
FIG. 3 is a block diagram illustrating an interface circuit of FIG. 1.

FIG. 3 is a block diagram illustrating an interface circuit of a memory controller. For example, the interface circuit may be the interface circuit 110 of FIG. 1. Referring to FIG. 3, the interface circuit 110 may include a phase locked loop (PLL) 111, a clock divider 112, a phase controller 113, a command/address signal (C/A) transmitter 114, a clock transmitter 115, a write clock (WCK) transmitter 116, a read data strobe signal (RDQS) receiver 117, and a data transceiver 118. According to an embodiment, one or more of the components illustrated in FIG. 3 may be implemented as a circuit.

The phase locked loop 111 may generate a first internal clock signal ICS1.

The clock divider 112 may divide the first internal clock signal ICS1 and may generate a first divided internal clock signal dICS1 and a second divided internal clock signal dICS2. For example, the first divided internal clock signal dICS1 and the second divided internal clock signal dICS2 may have different phases. The first divided internal clock signal dICS1 may be associated with the clock signal CK to be transmitted to the memory device 200, and the second divided internal clock signal dICS2 may be associated with a command CMD and an address ADD to be transmitted to the memory device 200. For example, the clock signal CK may be generated based on the first divided internal clock signal dICS1 and the command/address (C/A) signal may be generated based on the second divided internal clock signal dICS2 and the command CMD and/or the address ADD. The clock divider 112 may be referred to as an internal clock divider.

The phase controller 113 may generate a second internal clock signal ICS2 based on the first internal clock signal ICS1. The second internal clock signal ICS2 may have a phase different from the phase of the first internal clock signal ICS1. For example, the first internal clock signal ICS1 and the second internal clock signal ICS2 may have a phase difference of 90 degrees, but the disclosure is not limited thereto.

The command/address transmitter 114 may transmit the command CMD and/or the address ADD based on the second divided internal clock signal dICS2. Accordingly, the command/address transmitter 114 may transmit the command/address signal C/A including the command CMD and/or the address ADD to the memory device 200.

The clock transmitter 115 may transmit the first divided internal clock signal dICS1 to the memory device 200 as the clock signal CK. For example, the clock transmitter 115 may generate the clock signal CK based on the first divided internal clock signal dICS1. For example, the clock transmitter 115 may generate a plurality of clocks (e.g., CK_t and CK_c) in a differential scheme based on the first divided internal clock signal dICS1 and may transmit the clocks CK_t and CK_c to the memory device 200.

The write clock transmitter 116 may transmit the first internal clock signal ICS1 to the memory device 200 as the write clock WCK. For example, the write clock transmitter 116 may generate a write clock signal based on the first internal clock signal ICS1. For example, the write clock transmitter 116 may generate a plurality of write clocks (e.g., WCK_t and WCK_c) in the differential scheme based on the first internal clock signal ICS1. and may transmit the write clocks WCK_t and WCK_c to the memory device 200. For example, the frequency of the write clock WCK may be two times the frequency of the clock signal CK, but the disclosure is not limited thereto. For example, the frequency of the write clock WCK may be different from the frequency of the clock signal CK.

The read data strobe signal receiver 117 may receive the read data strobe signal RDQS from the memory device 200. For example, the data signal DQ corresponding to the read data from the memory device 200 may be received based on the read data strobe signal RDQS. For example, the read data strobe signal RDQS may be used to receive the data signal DQ, which is the read data from the memory device 200. The read data strobe signal RDQS may be a signal based on a phase splitting of the clock signal CK by the memory device 200.

The data transceiver 118 may transmit the data "DATA" to the memory device 200 based on the second internal clock signal ICS2 or may receive the data "DATA" from the memory device 200 based on the second internal clock signal ICS2. Accordingly, the data transceiver 118 may transmit or receive the data signal DQ including the data "DATA" to or from the memory device 200.

As described above, the clock signal CK and the write clock WCK may be generated through one phase locked loop 111. This may mean that an operating current of the memory controller 100 is reduced.

Figure 4:
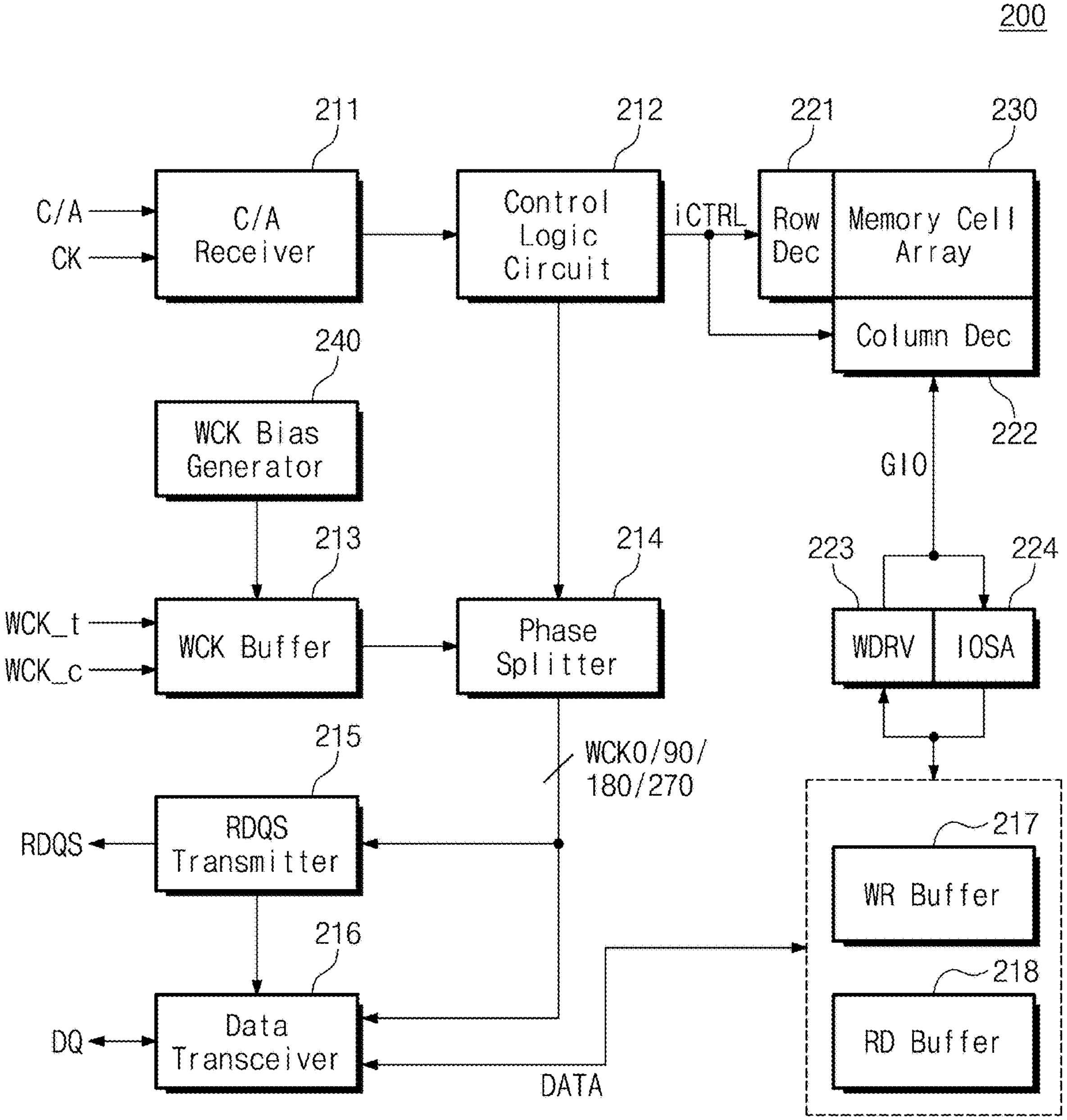
FIG. 4 is a block diagram illustrating a memory device of FIG. 1.

FIG. 4 is a block diagram illustrating a memory device of FIG. 1. Referring to FIG. 4, the memory device 200 may include a command/address signal (C/A) receiver 211, a control logic circuit 212, a WCK buffer 213, a phase splitter 214, a read data strobe signal (RDQS) transmitter 215, a data transceiver 216, and the memory cell array 230. According to an embodiment, the C/A receiver 211, the control logic circuit 212, the phase splitter 214, the RDQS transmitter 215, and the data transceiver 216 may be included in the interface circuit 210 of FIG. 1. According to an embodiment, one or more of the components illustrated in FIG. 4 may be implemented as a circuit.

The command/address signal receiver 211 may receive the command CMD by latching the command/address signal C/A based on the clock signal CK. The received command CMD may be provided to the control logic circuit 212. The command/address signal receiver 211 may receive an address by latching the command/address signal C/A based on the clock signal CK. The received address may be provided to an address register to be decoded. The address register may be provided inside the control logic circuit 212 or outside the control logic circuit 212.

The control logic circuit 212 may decode the received command CMD and may generate one or more control signals for controlling the remaining components of the memory device 200 depending on the decoded command CMD. For example, the control logic circuit 212 may generate the control signals iCTRL for storing the data "DATA" in the memory cell array 230 or outputting the data "DATA" from the memory cell array 230. For example, the control logic circuit 212 may decode an activate command, a read command, a write command, a precharge command, a mode register write command, a multi-purpose command (MPC), etc. However, the disclosure is not limited thereto, and as such, the control logic circuit 212 may be configured to decode other commands or perform other operations.

The WCK buffer 213 may receive the write clock WCK. For example, the write clock WCK may include the differential signals WCK_t and WCK_c. For example, the WCK buffer 213 may receive the write clock WCK and may provide the write clock WCK to the phase splitter 214. The WCK buffer 213 may operate based on the WCK bias (e.g., a bias voltage).

According to an embodiment, the memory device 200 may include a WCK bias generator 240. The WCK bias generator 240 may generate a bias voltage necessary for operating the WCK buffer 213. In an embodiment, the WCK bias generator 240 may be configured to generate the bias voltage by using a voltage regulator. Accordingly, compared to a replica-type bias generator, the WCK bias generator 240 may generate the bias voltage with a relatively small power and may provide a high power supply rejection ratio (PSRR).

The WCK bias generator 240 may detect a change of a threshold voltage of a transistor constituting the WCK buffer 213 and may perform calibration for compensating for the detected change. For example, the calibration of the WCK bias generator 240 may be performed once in the initialization of the memory device 200. Accordingly, the WCK bias generator 240 may include a separate compensation circuit to compensate for the change of the threshold voltage of the transistor constituting the WCK buffer 213 in real time after the initialization of the memory device 200. For example, the WCK bias generator 240 may include an NMOS transistor connected to a lower end of the voltage regulator. A configuration and an operation of the separate circuit will be described in detail with reference to FIG. 5 and the following drawings.

The phase splitter 214 may generate a plurality of internal write clocks WCK0, WCK90, WCK180, and WCK270 based on the write clock WCK. For example, the phase splitter 214 may generate the internal write clocks WCK0, WCK90, WCK180, and WCK270, which toggle based on the toggling of the write clock WCK. The phase splitter 214 may divide the frequency of the write clock WCK and may generate the internal write clocks WCK0, WCK90, WCK180, and WCK270 having different phases. For example, the phase splitter 214 may divide the frequency of the write clock WCK by half and may generate the internal write clocks WCK0, WCK90, WCK180, and WCK270 having different phases. In this case, the phases of the internal write clocks WCK0, WCK90, WCK180, and WCK270 may be 0 degree, 90 degrees, 180 degrees, and 270 degrees, respectively.

The RDQS transmitter 215 may generate the read data strobe signal RDQS based on the internal write clocks WCK0, WCK90, WCK180, and WCK270 and may transmit the read data strobe signal RDQS to the memory controller 100. For example, the RDQS transmitter 215 may transmit the read data strobe signal RDQS based on the rising edge and/or the falling edge of at least one of the internal write clocks WCK0, WCK90, WCK180, and WCK270. The read data strobe signal RDQS may include differential signals (e.g., RDQS_t and RDQS_c). The frequency of the read data strobe signal RDQS, which is transmitted to the memory controller 100, may be identical (or same) to the frequency of the write clock WCK. However, the disclosure is not limited thereto, and as such, the frequency of the read data strobe signal RDQS may be different from the frequency of the write clock WCK.

The data transceiver 216 may transmit/receive the data signal DQ including the data "DATA" based on the internal write clocks WCK0, WCK90, WCK180, and WCK270.

In the write operation, the data transceiver 216 may receive the data "DATA" by latching the data signal DQ based on the internal write clocks WCK0, WCK90, WCK180, and WCK270. For example, the data transceiver 216 may latch the data signal DQ received from the memory controller 100 based on the rising edges and/or the falling edges of the internal write clocks WCK0, WCK90, WCK180, and WCK270. The received data "DATA" may be transferred and stored to the memory cell array 230. In an example case in which the data "DATA" are transferred to the memory cell array 230, the data "DATA" may be transferred based on the toggle timings of the clock signal CK. That is, in the case where the data "DATA" are transferred to the memory cell array 230, there may be made a domain change from a write clock (WCK) domain to a clock signal (CK) domain.

In the read operation, the data transceiver 216 may transmit the data signal DQ including the data "DATA" to the memory controller 100 based on the internal write clocks WCK0, WCK90, WCK180, and WCK270. The data "DATA" may be read from the memory cell array 230. For example, the data transceiver 216 may transmit the data "DATA" based on the rising edge and/or the falling edge of at least one of the internal write clocks WCK0, WCK90, WCK180, and WCK270. Accordingly, the data "DATA" may be transmitted to the memory controller 100 in a state of being aligned with the toggle timings of the read data strobe signal RDQS. In an example case in which the data "DATA" are read from the memory cell array 230, the data "DATA" may be read based on the toggle timings of the clock signal CK. The data transceiver 216 may align the read data "DATA" with the toggle timings of the read data strobe signal RDQS so as to transmitted to the memory controller 100. That is, in the case where the data "DATA" are transmitted to the memory controller 100, there may be made a domain change from the clock signal (CK) domain to a read data strobe signal (RDQS) domain (e.g., the write clock (WCK) domain).

As described above, the memory device 200 may generate the read data strobe signal RDQS and the data signal DQ based on the internal write clocks WCK0, WCK90, WCK180, and WCK270. According to an embodiment, because the internal write clocks WCK0, WCK90, WCK180, and WCK270 are generated based on the write clock WCK, the read data strobe signal RDQS and the data signal DQ may be generated based on the write clock WCK. In this case, the power consumption of the memory device 200 may be reduced compared to the case where the read data strobe signal RDQS and the data signal DQ are generated based on the clock signal CK.

According to an embodiment, the memory device 200 may further include a write buffer 217 and a read buffer 218. For example, the write buffer 217 may receive the data signal DQ, which is the write data, from the data transceiver 216. The write buffer 217 may parallelize the data signal DQ and may store the parallelized data signal DQ in a FIFO of the write buffer 217. The write buffer 217 may provide the write data stored in the FIFO to a write driver 223.

For example, the read buffer 218 may receive the read data from an input/output sense amplifier 224. The read buffer 218 may store the received read data in the FIFO of the read buffer 218. The read buffer 218 may serialize the read data and may provide the serialized read data to the data transceiver 216.

According to an embodiment, the memory device 200 may further include a row decoder 221, a column decoder 222, a write driver 223 and a memory cell array 230. For example, the row decoder 221 may decode a row address under control of the control logic circuit 212. The row decoder 221 may select and activate at least one word line corresponding to the row address.

For example, the column decoder 222 may decode a column address under control of the control logic circuit 212. The column decoder 222 may select and activate at least one column selection line corresponding to the column address. Two or more bit lines may be connected to a column selection line. For example, memory cells corresponding to the row address and the column address may be selected, and a data input/output operation on the selected memory cells may be performed.

For example, the write driver 223 may receive the write data from the write driver 217 and may write the write data in the selected memory cells through an input/output line GIO. The input/output sense amplifier 224 may sense the read data output from the selected memory cells through the input/output line GIO and may provide the read data to the read buffer 218.

For example, the memory cell array 230 may include a plurality of memory cells connected with word lines and bit lines. For example, the memory cell may be a dynamic random access memory (DRAM) cell. In this case, the interface circuit 110 (refer to FIG. 1) and the memory device 200 may communicate with each other based on one of the standards such as double data rate (DDR), low power double data rate (LPDDR), graphics double data rate (GDDR), wide I/O, high bandwidth memory (HBM), hybrid memory cube (HMC), etc.

Figure 5:
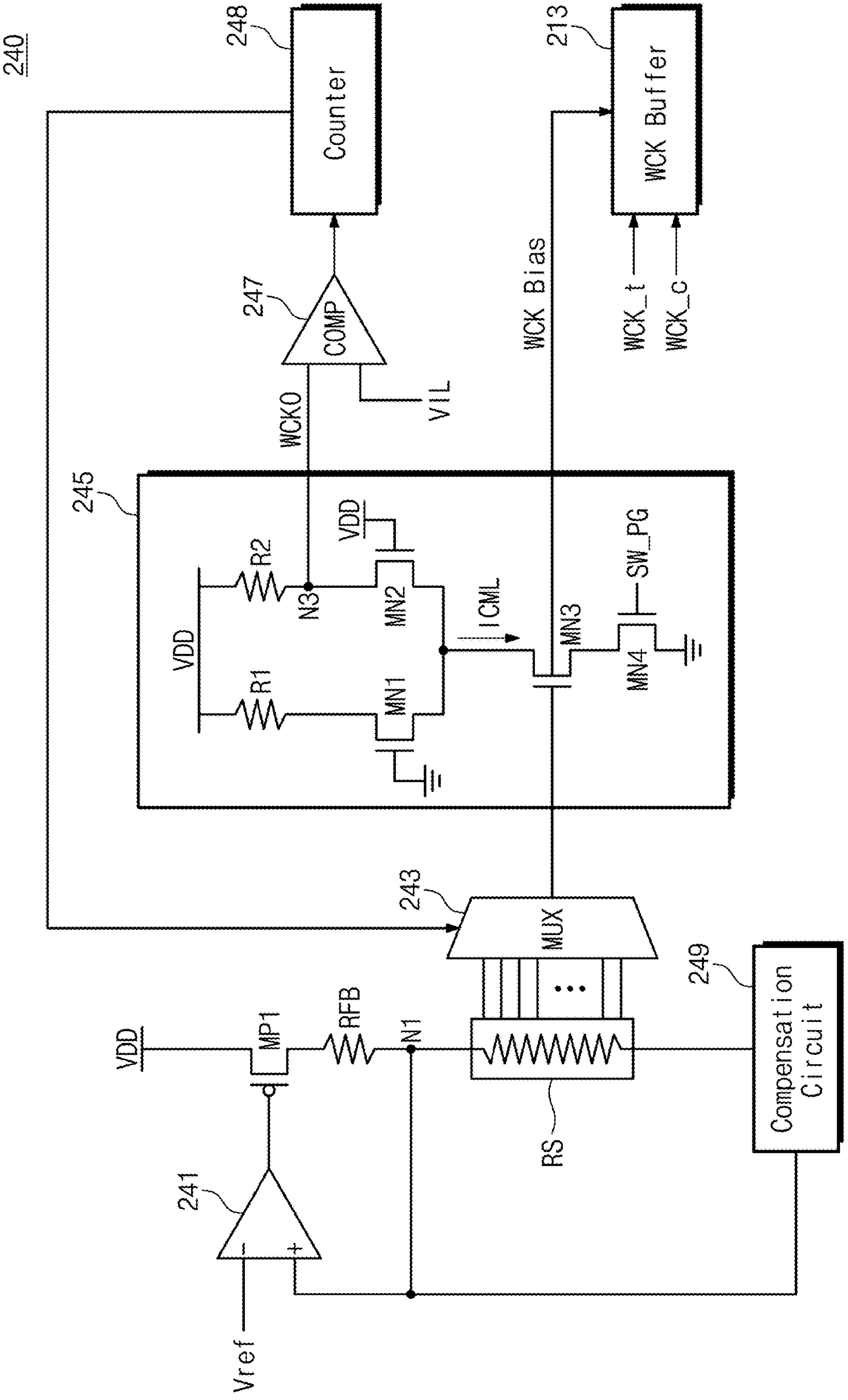
FIG. 5 is a circuit diagram illustrating a configuration of a write clock (WCK) bias generator of FIG. 4.
Figure 6:
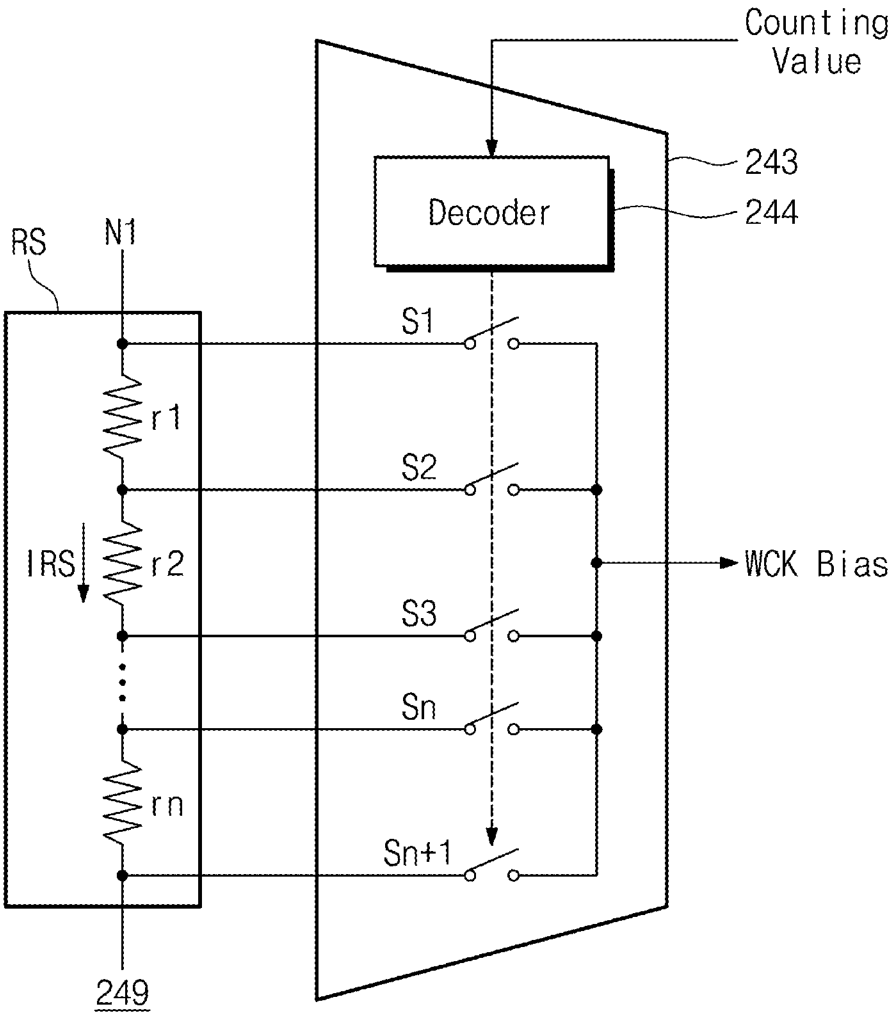
FIG. 6 is a circuit diagram illustrating a configuration of a resistor string and a multiplexer of FIG. 5.

FIG. 5 is a circuit diagram illustrating a configuration of a WCK bias generator of FIG. 4. FIG. 6 is a circuit diagram illustrating a configuration of a resistor string RS and a multiplexer 243 of FIG. 5. Below, an operation of the WCK bias generator 240 will be described with reference to FIGS. 5 and 6. According to an embodiment, one or more of the components illustrated in FIG. 5 may be implemented as a circuit.

In an embodiment, the WCK bias generator 240 may include an error amplifier 241, a P-channel Metal-Oxide-Semiconductor (PMOS) transistor MP1, a feedback resistor RFB, a resistor string RS, a multiplexer 243, a replica buffer 245, a comparator 247, a counter 248, and a compensation circuit 249. The error amplifier 241 may mean an operational amplifier for error detection. The PMOS transistor MP1 may be referred to as a "pass transistor". The disclosure is not limited thereto, and as such, the WCK bias generator 240 may include one or more other components, or omit one or more other components. According to an embodiment, the transistor MP1 is not limited to a PMOS transistor. As such, another type of transistor may be used.

According to an embodiment, the error amplifier 241, the PMOS transistor MP1, and the feedback resistor RFB may constitute a voltage regulator. The voltage regulator may receive a reference voltage Vref and may output a voltage for turning on the PMOS transistor MP1. The PMOS transistor MP1 may output the voltage to a node N1 based on an output voltage of the error amplifier 241, and a level of the voltage (e.g., a voltage level) of the node N1 may be the same as a level of the reference voltage Vref. For example, the reference voltage Vref may be generated from a bandgap reference circuit.

Figure 8:
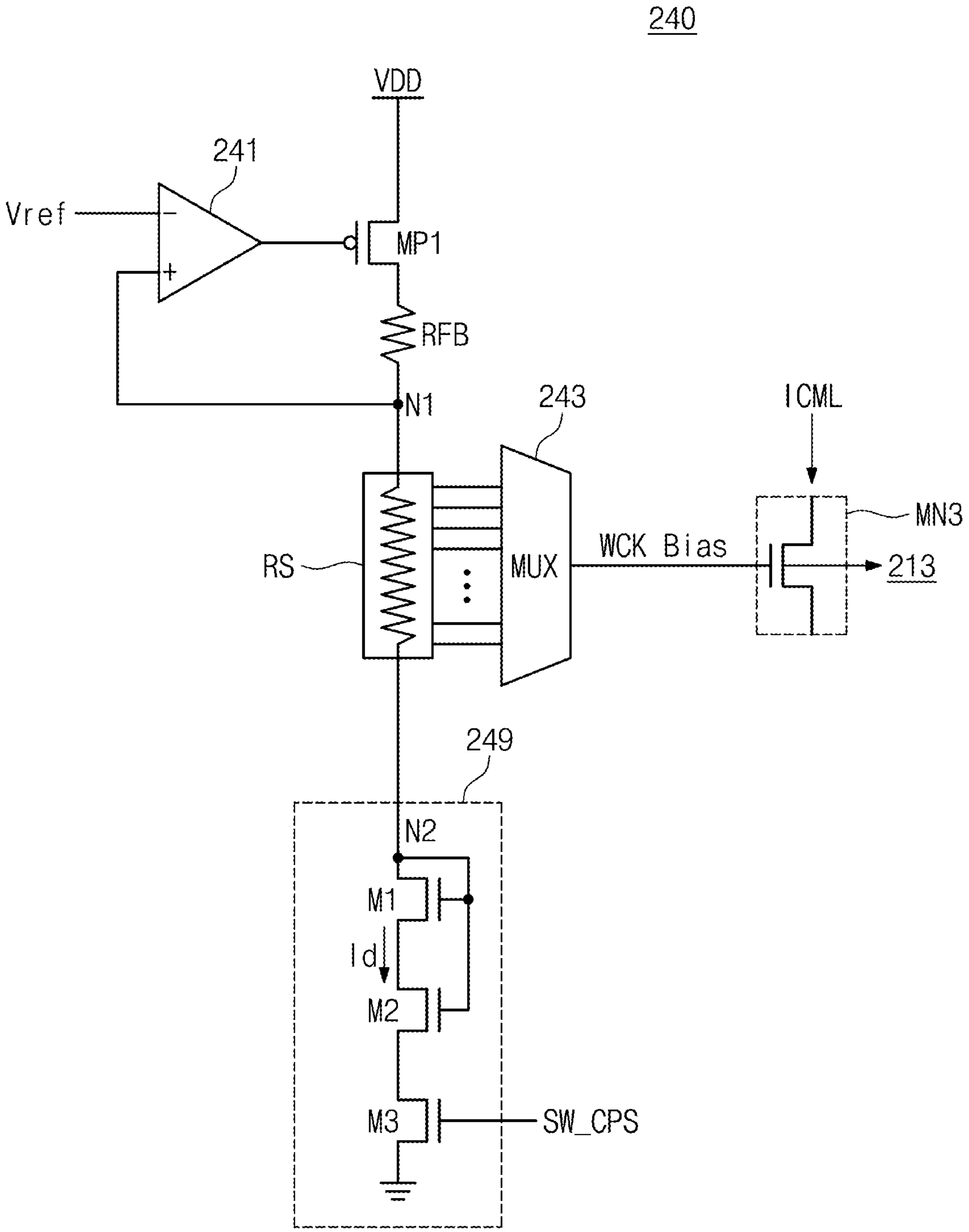
FIG. 8 is a circuit diagram illustrating a compensation circuit of FIG. 5.

The resistor string RS may include a plurality of resistors r1 to rn connected between the node N1 and a node N2 (refer to FIGS. 6 and 8). Here, 'n' is a natural number. The multiplexer 243 may be configured to perform a switching operation between the node N1, the node N2, and nodes between the plurality of resistors r1 to rn constituting the resistor string RS such that a resistance value of the resistor string RS varies. In an embodiment, the multiplexer 243 may include a plurality of switches S1 to Sn+1 and a decoder 244. For example, the plurality of switches S1 to Sn+1 may be connected between the node N1, the node N2, and the nodes between the resistors r1 to rn.

In an embodiment, the plurality of switches S1 to Sn+1 may be controlled by control signals generated by the control logic circuit 212 (refer to FIG. 4). For example, the plurality of switches S1 to Sn+1 may be individually controlled. In this case, the WCK bias may be output from one of the node N1, the node N2, and nodes between the plurality of resistors r1 to rn constituting the resistor string RS through the multiplexer 243. In other words, the resistor string RS and the multiplexer 243 may be regarded as a kind of voltage division circuit outputting the WCK bias based on a feedback voltage (e.g., the voltage of the node N1).

For example, the replica buffer 245 may replicate a target bias current flowing to the WCK buffer 213 to generate a current ICML. The replica buffer 245 may also output an output voltage WCKO based on a power supply voltage VDD and a ground voltage. For example, the replica buffer 245 may be configured to receive a power supply voltage VDD and a ground voltage and to output an output voltage WCKO. In an embodiment, the replica buffer 245 may include a first load resistor R1, a second load resistor R2, a first transistor MN1, a second transistor MN2, a third transistor MN3, and a fourth transistor. The third transistor MN3 may be driven by the WCK bias, and the fourth transistor MN4 may be turned on or turned off by a pass gate switching signal SW_PG. According to an embodiment, the first to fourth transistor MN1 to MN4 may be an NMOS switching element. However, the disclosure is not limited thereto, and as such, the transistor and/or the switching elements may be implemented in a different manner.

The WCK bias generator 240 may perform calibration in the initialization of the memory device 200 (refer to FIG. 1). For example, in the initialization of the memory device 200 (refer to FIG. 1), as the WCK bias is input to the transistor MN3 and the pass gate switching signal SW_PG is input to the transistor MN4, the calibration may be started. According to an embodiment, because the transistor MN1 is turned off by the ground voltage and the transistor MN2 is turned on by the power supply voltage VDD, the current ICML may flow through a path formed by the power supply voltage VDD, the resistor R2, and the second to fourth transistors MN2, MN3, and MN4. In this case, a voltage drop may be caused by the resistor R2, and the output voltage WCKO may be output through a node N3 between the resistor R2 and the transistor MN2.

The comparator 247 may compare the output voltage WCKO and a reference voltage VIL and may output a comparison result to the counter 248. The reference voltage VIL may be target voltage.

The comparator 247 may be implemented with various logic elements to perform the above comparison operation. The counter 248 may perform a counting operation based on the comparison result received from the comparator 247.

In an example case in which the current ICML is smaller than a reference current, a value of the voltage of the node N3 or the output voltage WCKO may be expressed by VDD−ICML×R2. The reference current may be a target current intended to flow along the path formed by the resistor R2 and the transistors MN2, MN3, and MN4. In this case, the voltage of the node N3 may be greater than the value of the target voltage VIL. That is, the relationship expressed by Equation 1 below may be established between the voltage of the node N3 and the target voltage VIL. The counter 248 may increase a counting value by "1". The counter 248 may output the counting value to the multiplexer 243.

$$VDD - ICML \times R2 > VIL \qquad \text{[Equation 1]}$$

The multiplexer 243 may decode the counting value received from the counter 248 and may generate signals for controlling the switches S1 to Sn+1. For example, the decoder 244 may generate the signals for controlling the switches S1 to Sn+1 such that the level of the WCK bias increases by one step. For example, it is assumed that, initially, the switches S3 and Sn+1 are turned on and the remaining switches are turned off. In this case, the value of the WCK bias may be expressed by VFB−(r1+r2)×IRS. Herein, VFB may indicate a feedback voltage as a value of the voltage of the node N1. In an example case in which the counting value increases by "1" while the calibration is performed, the switches S2 and Sn+1 may be turned on, and the remaining switches may be turned off. As a result, the value of the WCK bias may increase to VFB−r1×IRS. As the value of the WCK bias increases, the value of the current ICML may become greater, and the value of the output voltage WCKO may become smaller.

On the other hand, in another example case in which the current ICML is greater than the target current, the relationship expressed by Equation 2 below may be established between the voltage of the node N3 and the target voltage. In this case, the counter 248 may decrease the counting value by "1". The counter 248 may output the counting value (e.g., −1) to the multiplexer 243.

$$VDD - ICML \times R2 < VIL \qquad \text{[Equation 2]}$$

The multiplexer 243 may decode the counting value received from the counter 248 and may generate signals for controlling the switches S1 to Sn+1. For example, the decoder 244 may generate the signals for controlling the switches S1 to Sn+1 such that the level of the WCK bias decreases by one step. For example, assuming that, initially, the switches S3 and Sn+1 are turned on and the remaining switches are turned off, as the counting value decreases by "1", the switches S4 and Sn+1 may be turned on, and the remaining switches may be turned off. As a result, the value of the WCK bias may decrease to VFB−(r1+r2+r3)×IRS. As the value of the WCK bias decreases, the value of the current ICML may become smaller, and the value of the output voltage WCKO may become greater.

The above calibration loop may be performed at least once and may be performed until the value of the WCK bias converges into a specific value and is stabilized.

Figure 7:
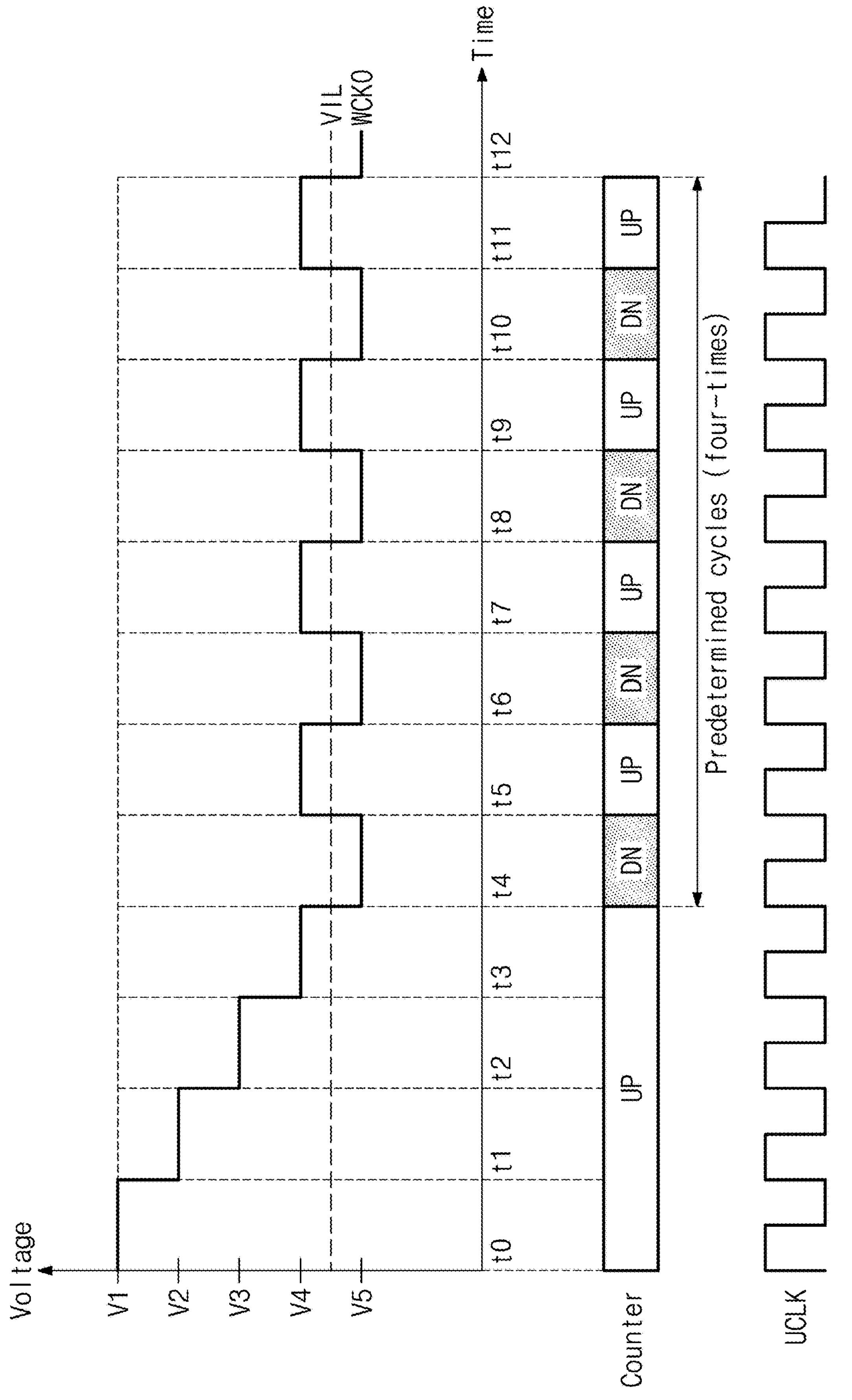
FIG. 7 is a diagram illustrating waveforms of signals associated with calibration which is performed by a WCK bias generator of FIG. 5.

FIG. 7 is a diagram illustrating waveforms of signals associated with calibration which is performed by the WCK bias generator 240 of FIG. 5. For example, FIG. 7 shows input signals of the comparator 247 and an operation of the counter 248. The counter 248 may operate based on an internal clock UCLK.

Referring to FIGS. 5 and 7, in the initialization of a memory device, at a point in time t0, the WCK bias generator 240 may start calibration. In an embodiment, based on an initial WCK bias output by the multiplexer 243, the replica buffer 245 may output an initial output voltage WCKO with a value of V1.

In a time interval from t0 to t1, the WCK bias generator 240 may compare the value (e.g., V1) of the output voltage WCKO of the replica buffer 245 and the target voltage VIL and may output a comparison result. Because the value V1 of the output voltage WCKO is greater than the value of the target voltage VIL, the counter 248 may increase the counting value (UP). The multiplexer 243 may output the WCK bias whose value is increased by one step, based on the counting value.

At the point in time t1, the value of the current ICML may be increased by the WCK bias with the increased value, and simultaneously, the value of the output voltage WCKO may decrease from V1 to V2. The above calibration loop may be repeatedly performed until a point in time t4. As a result, the value of the WCK bias may continuously increase, and the value of the output voltage WCKO corresponding to the WCK bias may continuously decrease to V5.

In a time interval from t4 to t5, the WCK bias generator 240 may compare the value (e.g., V5) of the output voltage WCKO of the replica buffer 245 and the target voltage VIL and may output a comparison result. Because the value V5 of the output voltage WCKO is smaller than the value of the target voltage VIL, the counter 248 may decrease the counting value (DN). The multiplexer 243 may output the WCK bias whose value is decreased by one step, based on the counting value.

At the point in time t5, the value of the current ICML may be decreased by the WCK bias with the decreased value, and simultaneously, the value of the output voltage WCKO may increase from V5 to V4.

According to an embodiment, the value of the output voltage WCKO may toggle between V4 and V5 based on the calibration after the point in time t5. In this case, the memory device 200 may determine the value of the output voltage WCKO is locked. In an embodiment, based on the value of the output voltage WCKO toggling a reference number of times, the memory device 200 may determine that the value of the output voltage WCKO is locked. For example, in case in which the value of the output voltage WCKO toggles for four cycles, the memory device 200 may determine that the value of the output voltage WCKO is locked. In another embodiment, based on a reference amount of time passing after the calibration is performed at the point in time t0, the memory device 200 may determine that the value of the output voltage WCKO is locked. For example, after a first period of time from the start of the calibration at time to, the memory device 200 may determine that the value of the output voltage WCKO is locked. In an example case in which it is determined that the value of the output voltage WCKO is locked, the calibration which is performed by using the replica buffer 245, the comparator 247, and the counter 248 may be terminated. In an embodiment, whether the given time passes may be determined based on whether the number of toggling of the internal clock UCLK used for the counter 248 to operate exceeds the given number of times.

FIG. 8 is a circuit diagram illustrating a circuit diagram of the compensation circuit 249 of FIG. 5. For brevity of drawing, components (e.g., the comparator 247 and the counter 248) which do not operate after the calibration described with reference to FIGS. 5 to 7 is terminated are omitted, and only a part (e.g., MN3) of the replica buffer 245 is illustrated.

The compensation circuit 249 may include a plurality of transistors M1 to M3. The transistor M1 to M3 may be NMOS transistors. The transistors M1 and M2 may be diode-connected and may be connected in series. The transistor M3 may be a switching element for controlling an operation of the compensation circuit 249. The transistor M3 may be connected to the transistor M2. The transistor M3 may be controlled by a compensation switching signal SW_CPS. The transistors M1, M2, and M3 may constitute a first branch.

In an example case in which the WCK bias is locked through the compensation performed in the initialization of the memory device 200, temperature compensation may be performed by the compensation circuit 249. In an example case in which an ambient temperature increases, the threshold voltage of the transistor MN3 of the replica buffer 245 (refer to FIG. 5) may decrease. As such, a current Id flowing in the compensation circuit 249 should increase to maintain the level of the current ICML flowing in the replica buffer 245. This is because the level of the WCK bias is capable of decreasing by increasing the voltage drop by the resistor string RS through the increase in the magnitude of the current Id.

In another example case in which an ambient temperature decreases, the threshold voltage of the transistor MN3 of the replica buffer 245 (refer to FIG. 5) increases. That is, the current Id flowing in the compensation circuit 249 should decrease to maintain the level of the current ICML flowing in the replica buffer 245. This is because the level of the WCK bias is capable of increasing by decreasing the voltage drop by the resistor string RS through the decrease in the magnitude of the current Id.

In the case of using the transistors M1 and M2 diode-connected as illustrated in FIG. 8 to implement the above temperature compensation scheme, the current Id flowing through the transistors M1 and M2 may be expressed by Equation 3 below.

$$i_d = \frac{1}{2}\mu_n C_{ox}\frac{W}{L}(V_{GS} - V_{th})^2(1 + \lambda V_{DS}) \quad \text{[Equation 3]}$$

In Equation 3 above, $\mu_n$ may indicate mobility of a transistor, $C_{ox}$ may indicate a value of a capacitance of oxide, λ may indicate a temperature coefficient, "W" may indicate a width of a channel, "L" may indicate a length of a channel, $V_{GS}$ may indicate a gate-source voltage of a transistor, and $V_{DS}$ may indicate a drain-source voltage of a transistor.

Referring to Equation 3 above, in an example case in which an ambient temperature increases, the magnitude of the threshold voltage Vth decreases, and the level of the current Id flowing through the compensation circuit 249 increases. In another example case in which an ambient temperature decreases, the magnitude of the threshold voltage Vth increases, and the level of the current Id flowing through the compensation circuit 249 decreases. As a result, the above temperature compensation scheme may be implemented.

However, in the case of implementing the temperature compensation scheme by using only the diode-connected transistors M1 and M2, it may be difficult to compensate for the change of the ambient temperature sufficiently. For example, because the gate electrodes of the diode-connected transistors M1 and M2 are connected to the node N2 in common, in an example case in which a level of a threshold voltage of a transistor decreases due to an increase in a temperature, the magnitude of the current Id increases, and the drain-source voltage $V_{DS}$ of the transistors M1 and M2 decreases. As understood from Equation 3 above, in an example case in which the level of the drain voltage $V_{DS}$ decreases, a negative feedback that the level of the current Id decreases is formed. According to an embodiment, because a ratio of the drain-source voltage $V_{DS}$ and the gate-source voltage $V_{DS}$ of the diode-connected transistors M1 and M2 (e.g., $V_{DS}/V_{GS}$) is uniform, the gate-source voltage $V_{GS}$ of the diode-connected transistors M1 and M2 decreases depending on the decrease in the level of the drain-source voltage $V_{DS}$. As a result, the negative feedback may be strongly formed. This may mean that the fluctuations in the current Id according to the change of the temperature (or threshold voltage) may be less than expected.

Figure 9:
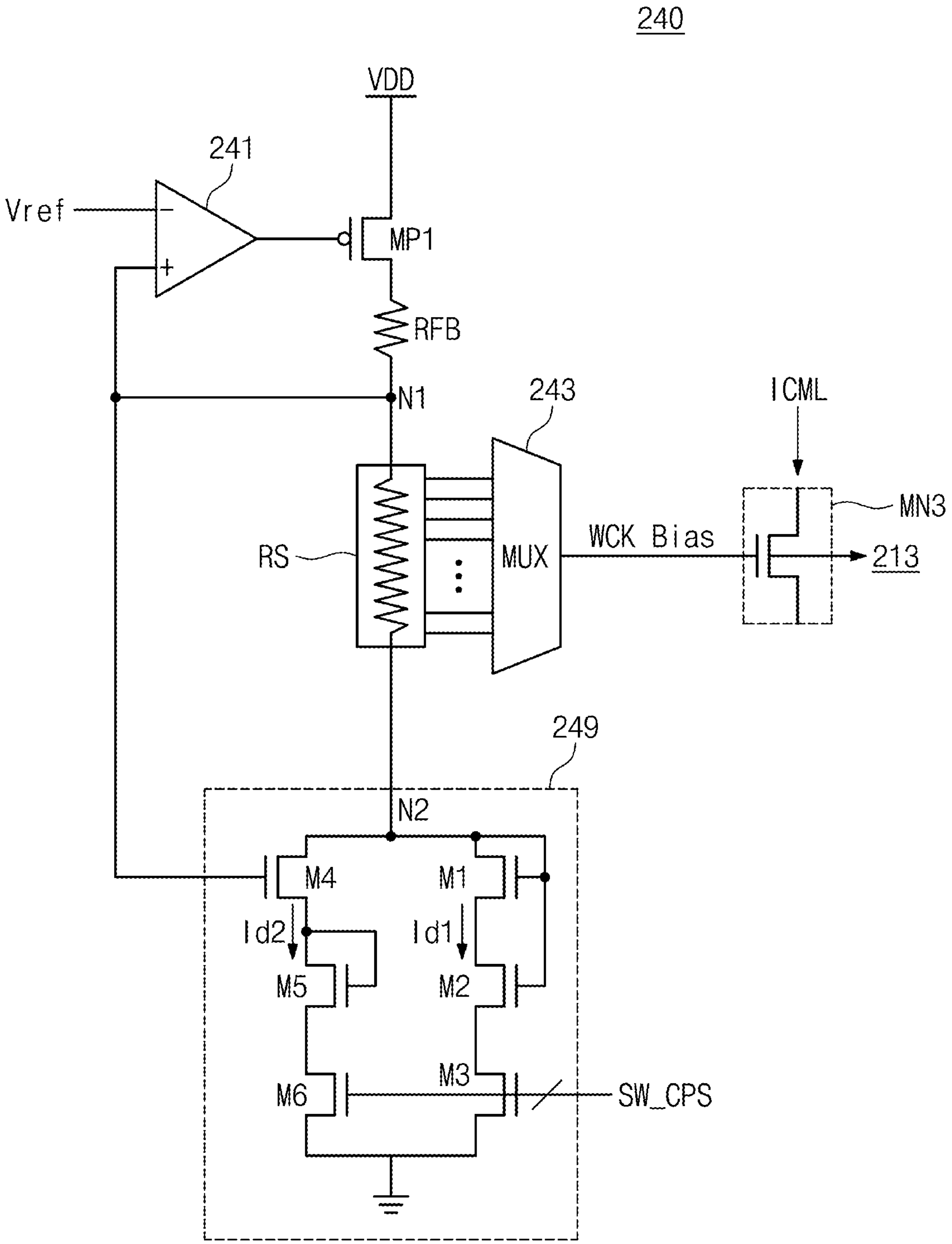
FIG. 9 is a circuit diagram illustrating a compensation circuit of FIG. 5.

Accordingly, to solve the above issue that the fluctuations in the current Id according to the change of the temperature (or threshold voltage) decrease, the compensation circuit 249 according to an embodiment of the disclosure may further include a branch as illustrated in FIG. 9.

FIG. 9 is a circuit diagram illustrating an example of the compensation circuit 249 of FIG. 5. As in the above description given with reference to FIG. 8, for brevity of drawing, some components (e.g., the comparator 247 and the counter 248) are omitted, and only a part (e.g., MN3) of the replica buffer 245 is illustrated.

The compensation circuit 249 may include NMOS transistors M1 to M6. The transistors M1 and M2 may be diode-connected and may be connected in series. The transistor M3 may be a switching element for controlling an operation of the compensation circuit 249 and the transistor M3 may be connected to the transistor M2. The transistor M3 may be controlled by the compensation switching signal SW_CPS. The transistors M1, M2, and M3 may constitute a first branch.

In an embodiment, a first end of the transistor M4 may be connected to the node N2, and a second end of the transistor M4 may be connected to the transistor M5. The transistor M5 may be a diode-connected transistor. A gate electrode of the transistor M4 may be connected to the node N1, and the transistor M4 may be driven by a feedback voltage. For example, the feedback voltage may be the voltage of the node N1. A second end of the transistor M5 may be connected to the transistor M6 which is a switching element for controlling an operation of the compensation circuit 249. The transistor M6 may be controlled by the compensation switching signal SW_CPS. The transistors M4, M5, and M6 may constitute a second branch. Meanwhile, the transistors M3 and M6 may be individually controlled by the compensation switching signal SW_CPS. However, according to an embodiment, this may not mean that the transistors M3 and M6 should be simultaneously turned on or turned off.

In an embodiment, the transistors M1 and M2 may be formed in a first layer, the transistors M2 and M5 may be formed in a second layer, and the transistors M3 and M6 may be formed in the first layer. That is, the transistors M1 to M6 may be formed in a form of a three-stage stack.

In an example case in which the first branch and the second branch are connected in parallel, the operation of the compensation circuit 249 of FIG. 9 may be somewhat different from the operation of the compensation circuit 249 of FIG. 8. For example, the drain-source voltage $V_{DS}$ and the gate-source voltage $V_{GS}$ of the transistor M4, which is driven by the feedback voltage (e.g., the voltage of the node N1), is proportional to a threshold voltage (e.g., $V_{DS}/V_{GS} \propto Vth$). Accordingly, the level of a current Id2 flowing through the transistor M4 may vary to be sensitive to the change of the threshold voltage. Also, because the gate-source voltage Vos of the transistor M4 is maintained by a kind of negative feedback caused at the diode-connected transistor M4, the fluctuations of the current Id2 flowing through the transistor M4, which are caused due to the change of the temperature or the threshold voltage, may become greater. For example, since the feedback voltage, which drives the transistor M4, is uniformly maintained with the reference voltage Vref regardless of pressure, volume, and temperature (PVT) changes, the gate-source voltage $V_{GS}$ of the transistor M4 may also be uniformly maintained.

As the change of the threshold voltage of the transistor is compensated for by the operation of the compensation circuit 249 described above, the level of the WCK bias may be compensated for. Accordingly, the WCK buffer 213 which is driven by the WCK bias may stably generate the target bias current.

Figure 10A:
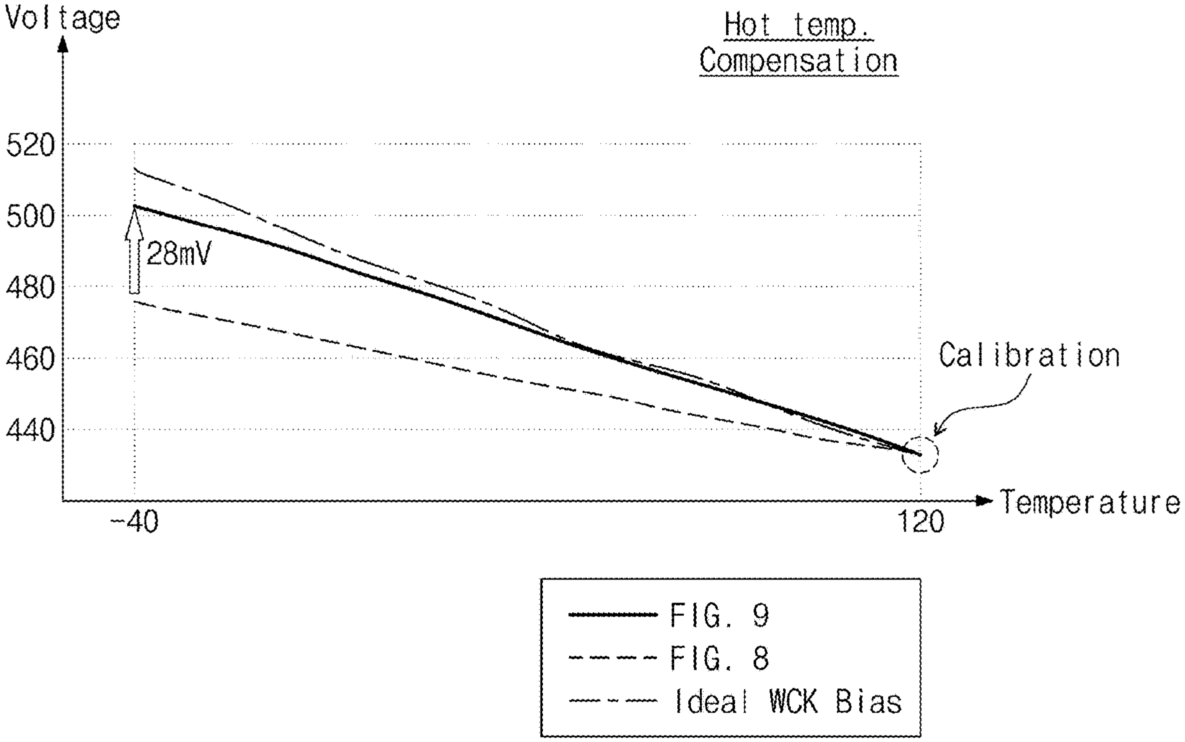
FIG. 10A is a graph comparing voltage levels of a WCK bias, which are formed through compensation performed at a high temperature.
Figure 10B:
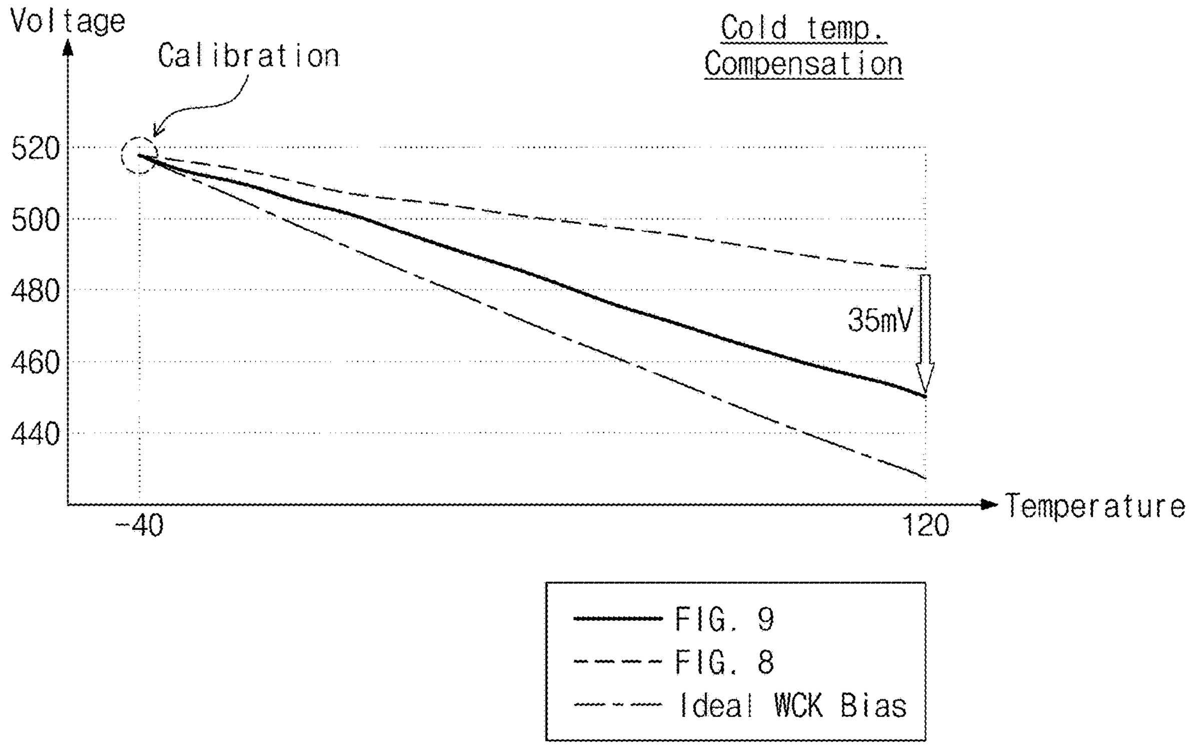
FIG. 10B is a graph comparing voltage levels of a WCK bias, which are formed through compensation performed at a low temperature.

FIG. 10A is a graph comparing voltage levels of a WCK bias, which are formed through compensation performed at a high temperature. FIG. 10B is a graph comparing voltage levels of a WCK bias, which are formed through compensation performed at a low temperature. In FIGS. 10A and 10B, the unit on the horizontal axis is Celsius, and the unit on the vertical axis is millivolts.

Referring to FIG. 10A, in an example case in which calibration is performed at a high temperature in the process of initializing a memory device, the WCK bias may be locked at about 440 mV. Afterwards, as the temperature decreases, compensation may be performed by a compensation circuit. In this case, a level of a threshold voltage of a transistor may increase, and a level of the WCK bias may increase.

In an example case in which compensation is performed by the compensation circuit 249 illustrated in FIG. 8, while the temperature decreases from 120° C. to −40° C., the value of the WCK bias may increase to a value which does not reach about 480 mV. Although the compensation circuit 249 of FIG. 8 operates to compensate for the change of the threshold voltage as described above, the value of the WCK bias is not sufficiently compensated because of the kind of negative feedback caused by the decrease in the level of the current Id.

In an example case in which compensation is performed by the compensation circuit 249 illustrated in FIG. 9, while the temperature decreases from 120° C. to −140° C., the value of the WCK bias may increase to a value which exceeds about 500 mV. In this case, it is observed that compensation is further made as much as about 28 mV, compared to the case using the compensation circuit 249 of FIG. 8.

Referring to FIG. 10B, in an example case in which calibration is performed at a low temperature in the process of initializing a memory device, the WCK bias may be locked at about 520 mV. Afterwards, as the temperature increases, compensation may be performed by a compensation circuit; in this case, a level of a threshold voltage of a transistor may decrease, and a level of the WCK bias may decrease.

As illustrated in FIG. 10B, in an example case in which compensation is performed by the compensation circuit 249 illustrated in FIG. 9, while the temperature increases from −40° C. to 120° C., the value of the WCK bias may decrease to about 490 mV. Although the compensation circuit 249 of FIG. 8 operates to compensate for the change of the threshold voltage, as described above, the value of the WCK bias is not sufficiently compensated because of the kind of negative feedback caused by the decrease in the level of the current Id.

In an example case in which compensation is performed by the compensation circuit 249 illustrated in FIG. 9, while the temperature increases from −40° C. to 120° C., the value of the WCK bias may decrease to about 450 mV. In this case, it is observed that compensation is further made as much as about 35 mV, compared to the case where the compensation circuit 249 of FIG. 8 operates.

Figure 11:
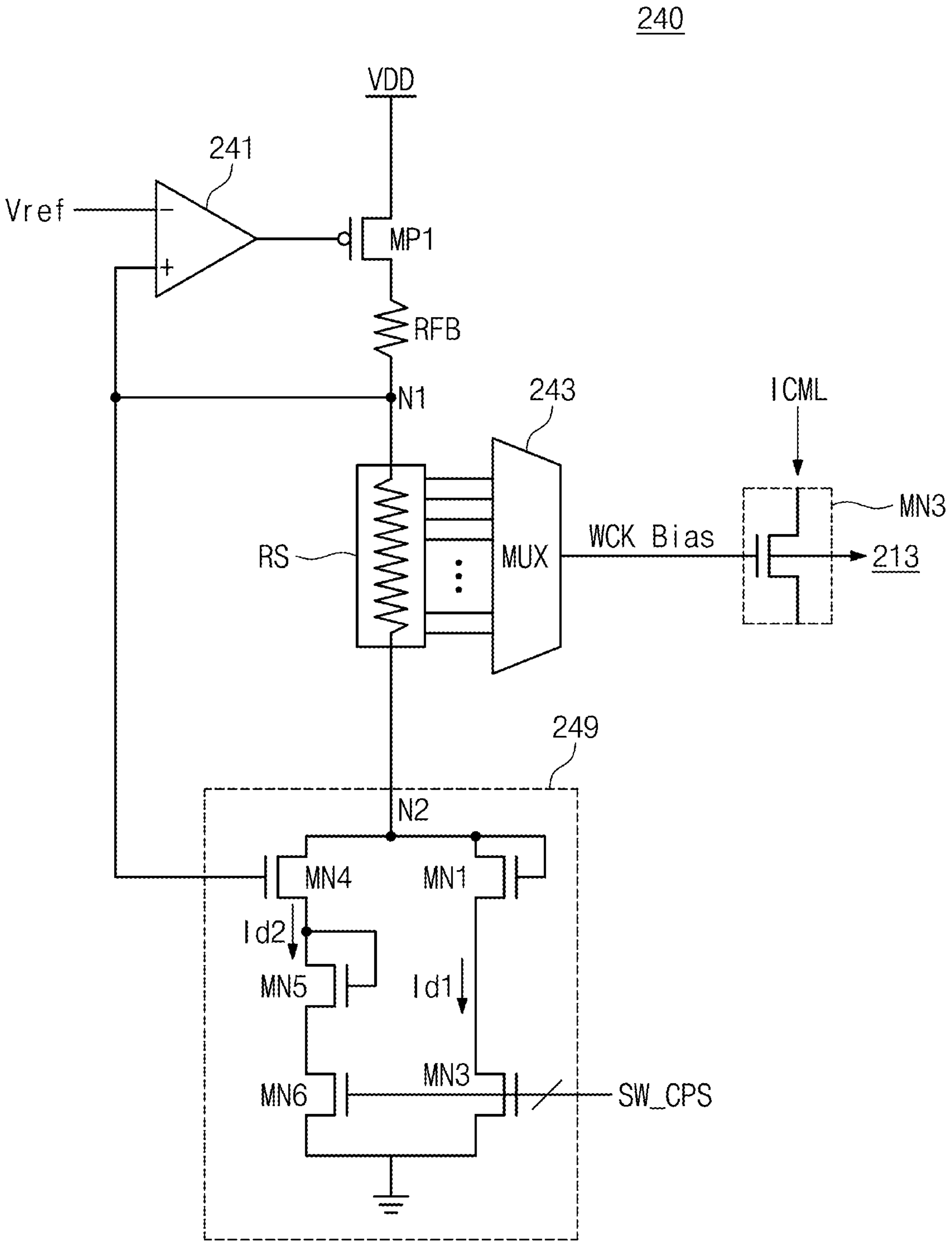
FIG. 11 is a circuit diagram illustrating a compensation circuit of FIG. 5.

FIG. 11 is a circuit diagram illustrating the compensation circuit 249 of FIG. 5. For brevity of drawing, some components (e.g., the comparator 247 and the counter 248) are omitted, and only a part (e.g., MN3) of the replica buffer 245 is illustrated.

The compensation circuit 249 may include NMOS transistors M1 and M3 to M6. The transistor M1 may be a diode-connected transistor. The transistor M3 may be a switching element for controlling an operation of the compensation circuit 249, and the transistor M3 may be connected to the transistor M1. The transistor M3 may be controlled by the compensation switching signal SW_CPS. The transistors M1 and M3 may constitute a first branch.

A first end of the transistor M4 may be connected to the node N2, and a second end thereof may be connected to the diode-connected transistor M5. A gate electrode of the transistor M4 may be connected to the node N1. A second end of the transistor M5 may be connected to the transistor M6 which is a switching element for controlling an operation of the compensation circuit 249. The transistor M6 may be controlled by the compensation switching signal SW_CPS. The transistors M4, M5, and M6 may constitute a second branch.

An operation of the compensation circuit 249 of FIG. 11 is mostly similar to the operation of the compensation circuit 249 illustrated in FIG. 9, and thus, additional description will be omitted to avoid redundancy.

Figure 12:
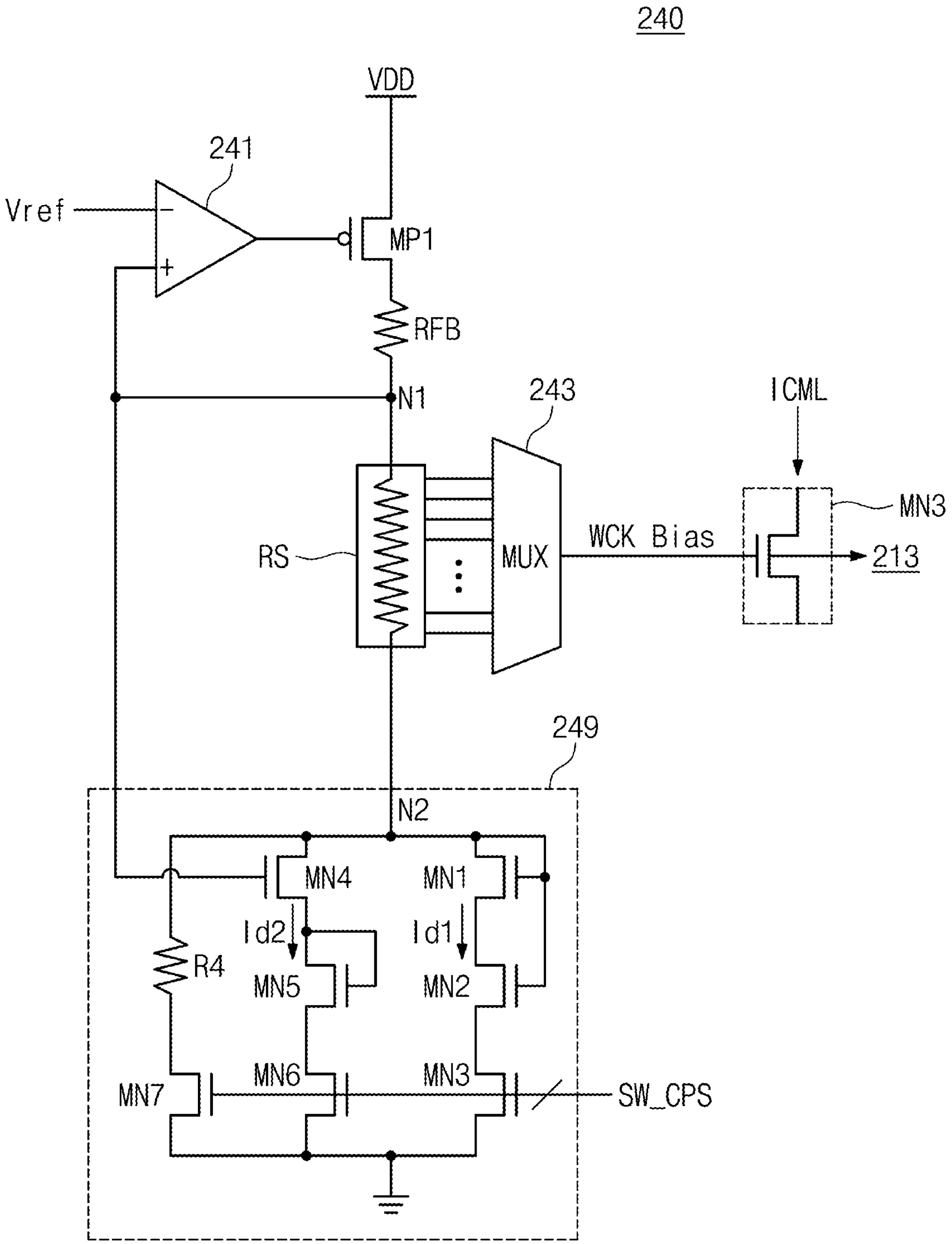
FIG. 12 is a circuit diagram illustrating a compensation circuit of FIG. 5.

FIG. 12 is a circuit diagram illustrating an example of the compensation circuit 249 of FIG. 5. For brevity of drawing, some components (e.g., the comparator 247 and the counter 248) are omitted, and only a part (e.g., MN3) of the replica buffer 245 is illustrated.

The compensation circuit 249 may include NMOS transistors M1 to M7 and a resistor R4. In an embodiment, the resistor R4 may be implemented with an actual resistor being a passive element, not a transistor with a resistance. The transistors M1 and M2 may be diode-connected. The transistor M3 which is a switching element for controlling an operation of the compensation circuit 249 may be connected to the transistor M2. The transistor M3 may be controlled by the compensation switching signal SW_CPS. The transistors M1, M2, and M3 may constitute a first branch.

A first end of the transistor M4 may be connected to the node N2, and a second end of the transistor M4 may be connected to the diode-connected transistor M5. A gate electrode of the transistor M4 may be connected to the node N1. A second end of the transistor M5 may be connected to the transistor M6 which is a switching element for controlling an operation of the compensation circuit 249. The transistor M6 may be controlled by the compensation switching signal SW_CPS. The transistors M4, M5, and M6 may constitute a second branch.

A first end of the resistor R4 may be connected to the node N2, and a second end of the resistor R4 may be connected to the transistor M7 being a switching element for controlling an operation of the compensation circuit 249. The transistor M7 may be controlled by the compensation switching signal SW_CPS. The resistor R4 and the transistor M7 may constitute a third branch.

An operation of the compensation circuit 249 of FIG. 12 may be mostly similar to the operation of the compensation circuit 249 illustrated in FIG. 9. However, because the first branch, the second branch, and the third branch are connected in parallel, the WCK bias may be compensated for through a sensitive reaction to the temperature change, and the WCK bias may also be stably maintained (or locked) at a given temperature.

Figure 13:
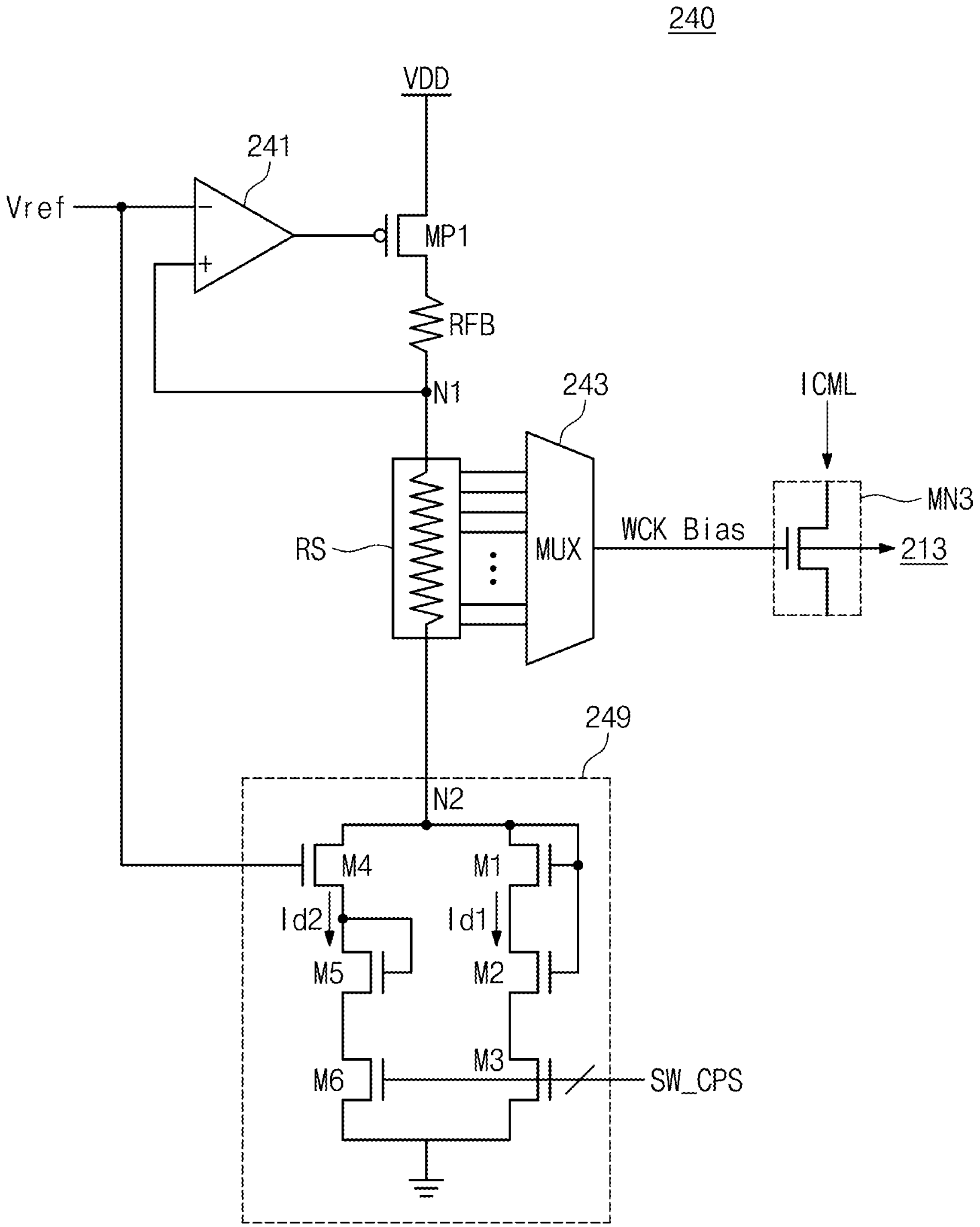
FIG. 13 is a circuit diagram illustrating a compensation circuit of FIG. 5.

FIG. 13 is a circuit diagram illustrating the compensation circuit 249 of FIG. 5. For brevity of drawing, some components (e.g., the comparator 247 and the counter 248) are omitted, and only a part (e.g., MN3) of the replica buffer 245 is illustrated.

A configuration and an operation of the compensation circuit 249 of FIG. 13 may be substantially the same as the configuration and the operation of the compensation circuit 249 of FIG. 9. However, a gate electrode of the transistor M4 may be connected to a node to which the reference voltage Vref is input, not the node N1. In an example case in which the error amplifier 241 is ideal, voltage levels of a negative input terminal and a positive input terminal of the error amplifier 241 may be identical. Accordingly, because the WCK bias generator 240 of FIG. 13 operates in substantially the same manner as the WCK bias generator 240 of FIG. 9, the WCK bias generator 240 of FIG. 13 may provide the same function as the WCK bias generator 240 of FIG. 9.

Figure 14:
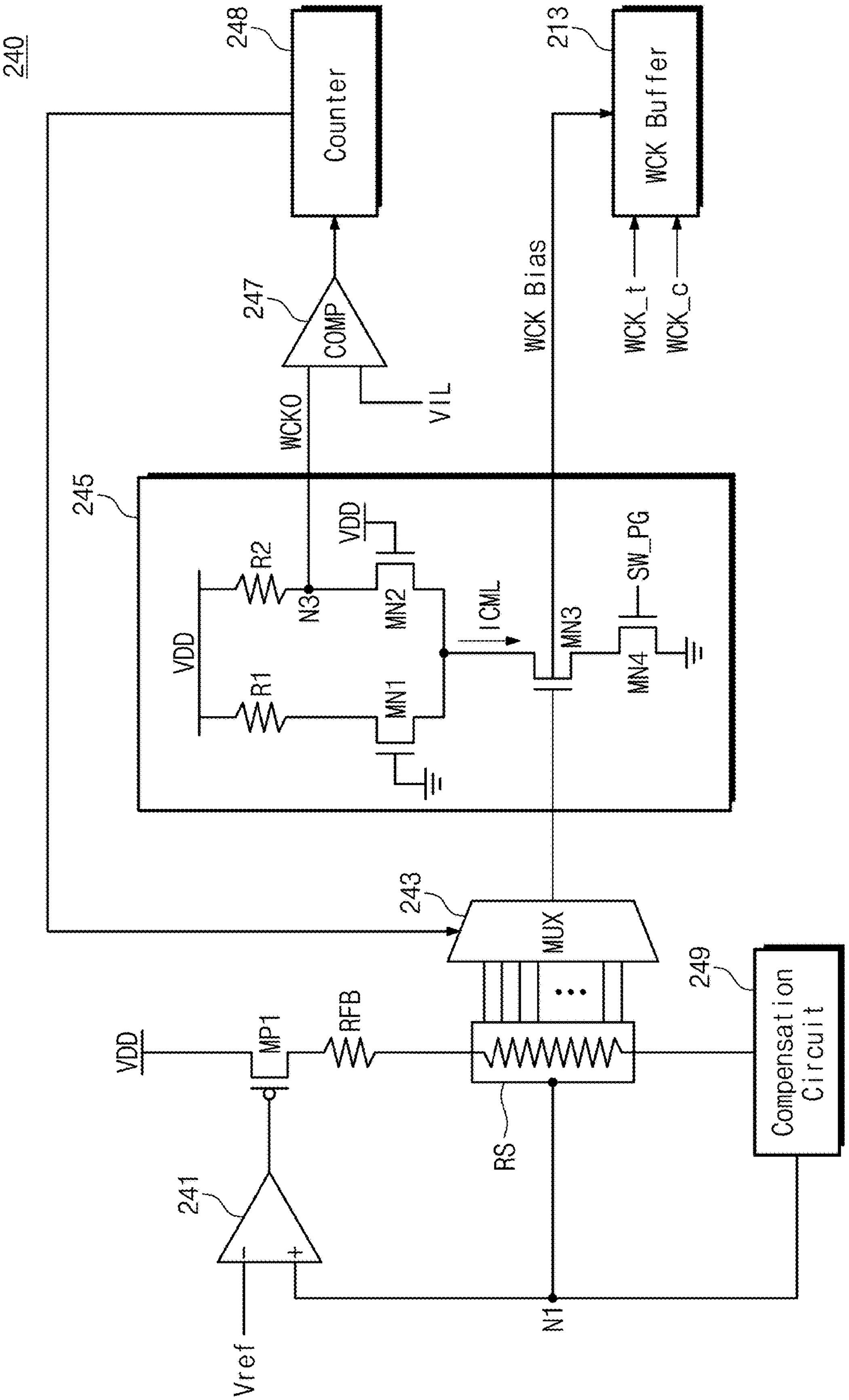
FIG. 14 is a circuit diagram illustrating a configuration of a WCK bias generator of FIG. 4.
Figure 15:
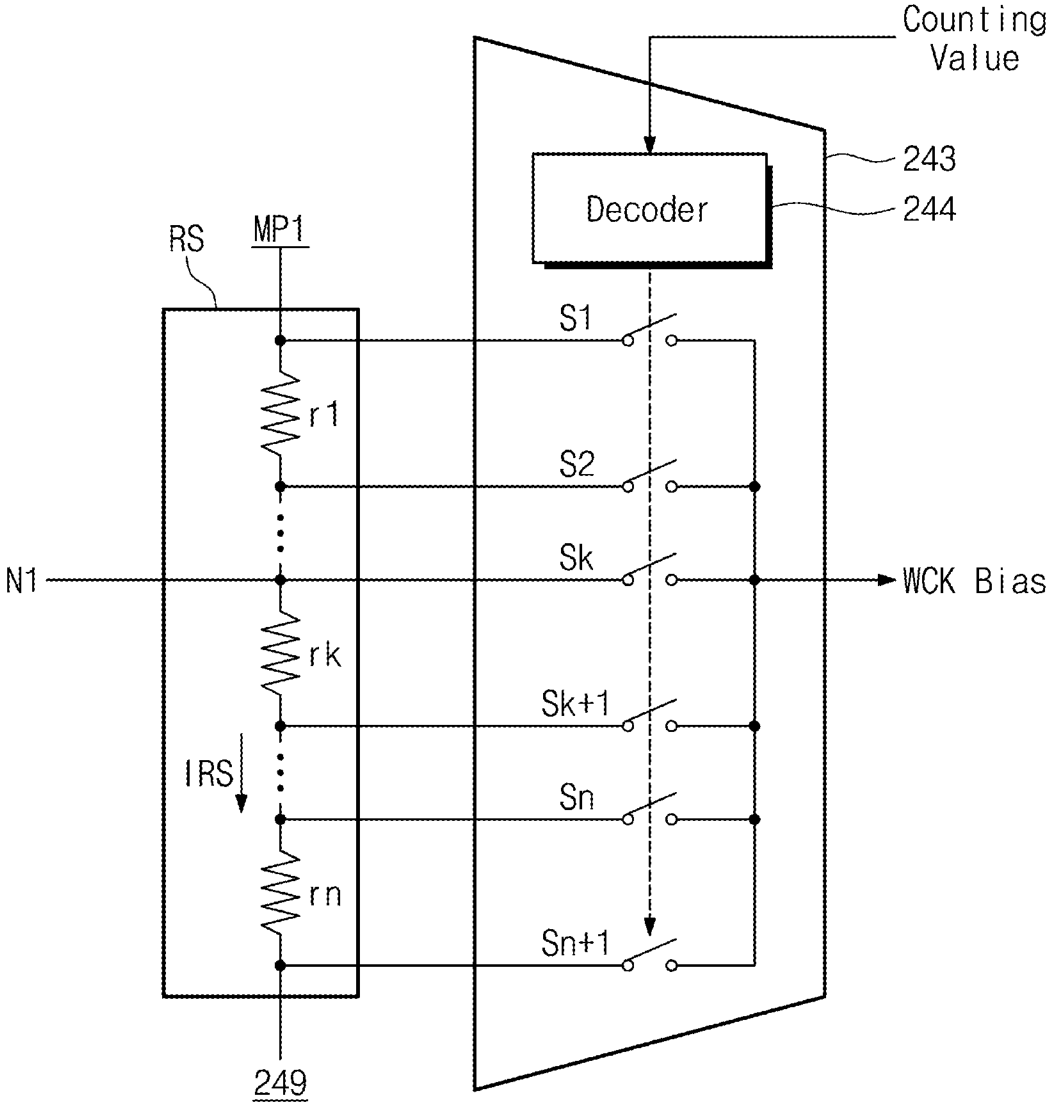
FIG. 15 is a circuit diagram illustrating a configuration of a resistor string and a multiplexer of FIG. 14.

FIG. 14 is a circuit diagram illustrating a configuration of a WCK bias generator of FIG. 4. FIG. 15 is a circuit diagram illustrating a configuration of the resistor string RS and the multiplexer 243 of FIG. 14. A configuration and an operation of the WCK bias generator 240 of FIG. 14 may be similar to the configuration and the operation of the WCK bias generator 240 of FIG. 5, and thus, a difference will be mainly described. Below, an operation of the WCK bias generator 240 will be described with reference to FIGS. 14 and 15.

In an embodiment, the WCK bias generator 240 may include the error amplifier 241, the PMOS transistor MP1, the resistor string RS, the multiplexer 243, the replica buffer 245, the comparator 247, the counter 248, and the compensation circuit 249. The error amplifier 241 and the PMOS transistor MP1 may constitute a voltage regulator. Alternatively, at least some of the error amplifier 241, the PMOS transistor MP1, and the resistor string RS may constitute a voltage regulator.

In an embodiment, the plurality of switches S1 to Sn+1 connected to the nodes of the resistor string RS may be individually controlled, for example, by the control logic circuit 212 (refer to FIG. 4). As a result, some of the resistors r1 to rn constituting the resistor string RS may perform substantially the same function as the feedback resistor RFB illustrated in FIG. 5. Accordingly, through the embodiments of FIGS. 14 and 15, the WCK bias generator 240 capable of varying the value of the feedback resistor RFB illustrated in FIG. 5 may be implemented.

Figure 16:
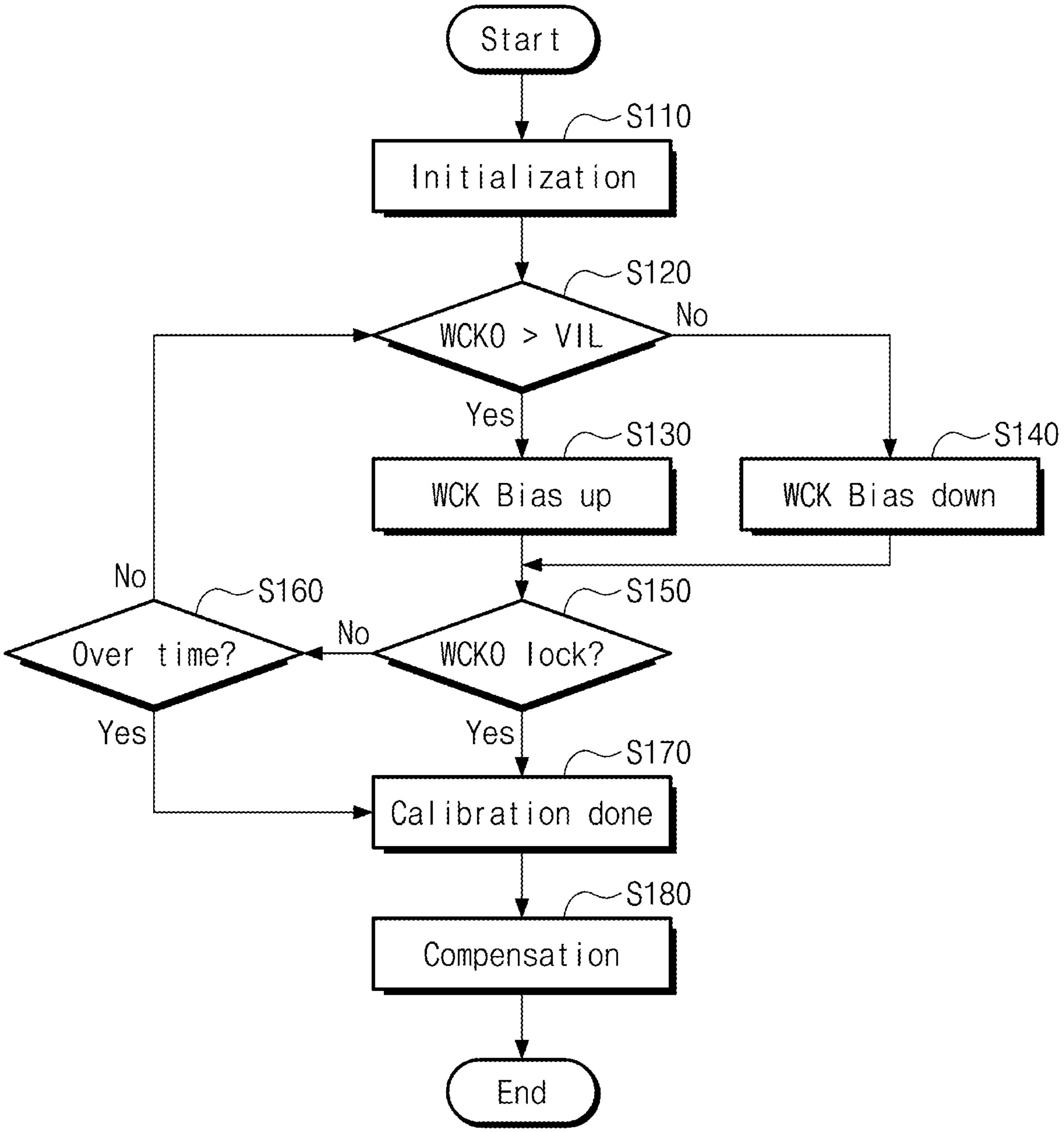
FIG. 16 is a flowchart illustrating an operating method of a WCK bias generator according to an embodiment of the disclosure.

FIG. 16 is a flowchart illustrating an operating method of a WCK bias generator according to an embodiment of the disclosure. For better understanding, an operating method of a WCK bias generator will be described with reference to FIGS. 4, 5, and 16.

In operation S110, the method may include performing an initialization. For example, the memory device 200 may perform initialization. In an example case in which the memory device 200 is powered on, the memory device 200 may perform initialization in compliance with a given manner. During the initialization, a memory controller may provide a power supply voltage to the memory device 200, may perform various initial setup operations, and may read or set necessary information from or to the memory device 200.

In operation S120, the method may include comparing the output voltage WCKO of the replica buffer 245 and a reference voltage (e.g., the target voltage VIL). For example, the output voltage WCKO of the replica buffer 245 and the target voltage VIL may be compared by the comparator 247. The comparator 247 may output a comparison result to the counter 248.

In operation S130, based on the comparison result indicating that the level of the output voltage WCKO is higher than the level of the target voltage VIL (Yes in S120), the level of the WCK bias may increase. For example, the counter 248 may increase a counting value by "1", and the multiplexer 243 may increase the level of the WCK bias by performing a switching operation according to the increased counting value.

In S140, based on the comparison result indicating that the level of the output voltage WCKO is smaller than the level of the target voltage VIL (No in S120), the level of the WCK bias may decrease. For example, the counter 248 may decrease the counting value by "1", and the multiplexer 243 may decrease the level of the WCK bias by performing a switching operation according to the decreased counting value.

In operation S150, the method may include determining that the output voltage WCKO is locked. For example, the WCK bias generator may determine whether the value of the output voltage WCKO is locked. For example, as the above calibration loop is repeated, the value of the output voltage WCKO may gradually converge into the value of the target voltage VIL. In operation S160, the method may include determining whether the value of the output voltage WCKO has toggled for a reference number of times. In operation S170, based on the value of the output voltage WCKO toggling for the reference number of times (Yes in S160), it may be determined that the value of the output voltage WCKO is locked. As a result, the calibration may be terminated). On the other hand, based on the value of the output voltage WCKO not toggling for the reference number of times (No in S160), operation S120 may be repeated.

In another embodiment, even though it may be determined that the value of the output voltage WCKO is not locked (No), in an example case in which a reference period of time passes after the calibration is started, it may be determined that the calibration is terminated (S170). For example, whether the given time passes may be determined based on the number of times of toggling of the internal clock UCLK (refer to FIG. 7).

In operation S180, the method may include compensating for a change of a threshold voltage due to a temperature change based on the calibration. For example, the compensation circuit 249 may compensate for a change of a threshold voltage due to a temperature change. The compensation circuit 249 may include, for example, a first branch which includes at least one diode-connected transistor (e.g., M1 and/or M2 of FIG. 9) and a second branch which includes the transistor M4 driven by a feedback voltage of a voltage regulator and the diode-connected transistor M5.

Figure 17:
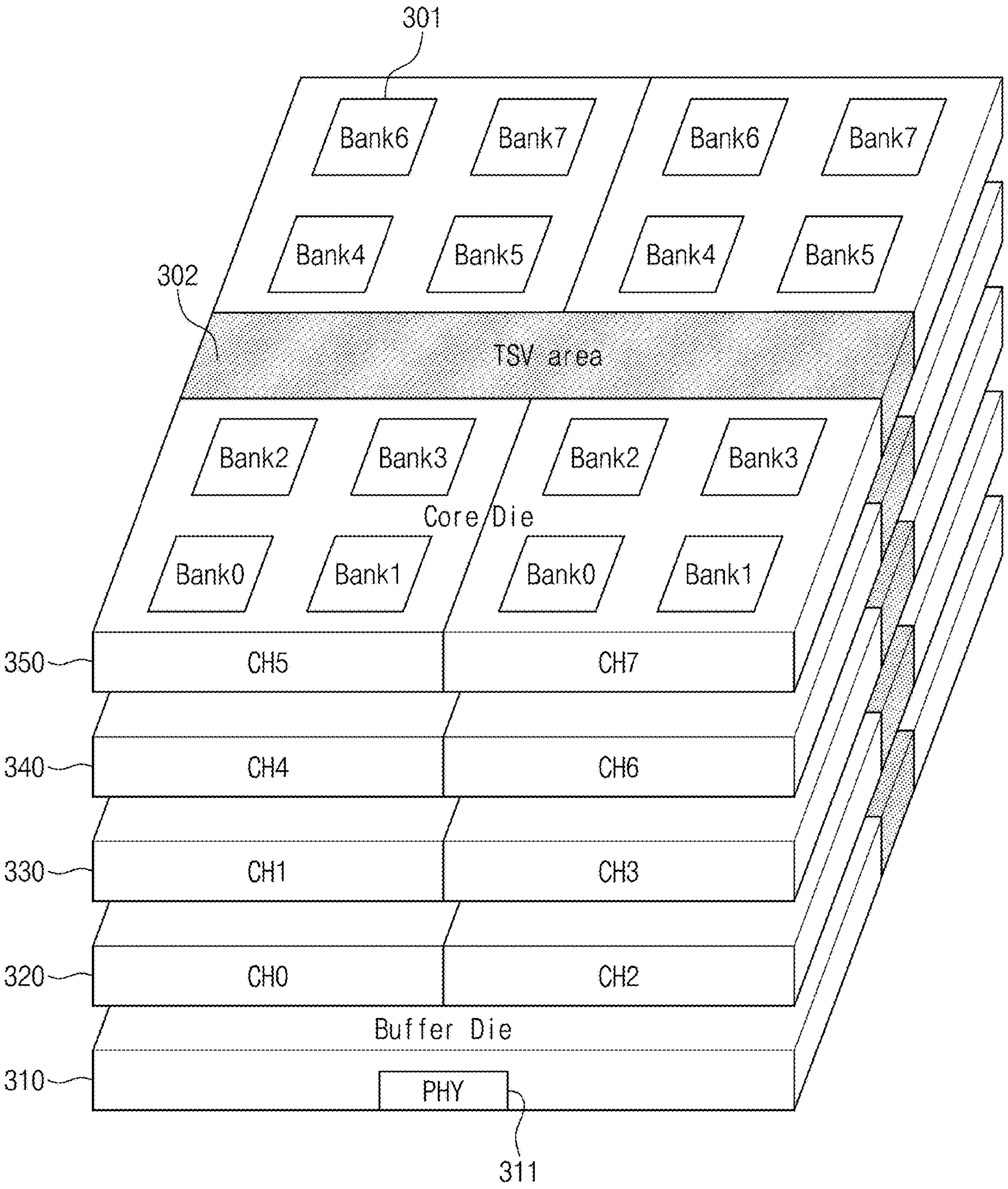
FIG. 17 is a diagram illustrating a stack-type memory device according to embodiments of the disclosure.

FIG. 17 is a diagram illustrating a stack-type memory device according to embodiments of the disclosure. A stack-type memory device 300 may include a buffer die 310 and a plurality of core dies 320 to 350. For example, the buffer die 310 may be also referred to as an "interface die", a "base die", a "logic die", or a "master die", and each of the core dies 320 to 350 may be also referred to as a "memory die" or a "slave die". An example is illustrated in FIG. 17 as the stack-type memory device 300 includes the four core dies 320 to 350, but the number of core dies may be variously changed. For example, the stack-type memory device 300 may include 8, 12, or 16 core dies.

The buffer die 310 and the core dies 320 to 350 may be stacked and may be electrically connected by using through silicon vias (TSV). Accordingly, the stack-type memory device 300 may have a three-dimensional memory structure in which the plurality of dies 310 to 350 are stacked. For example, the stack-type memory device 300 may be implemented in compliance with the HBM or HMC standard.

The stack-type memory device 300 may support a plurality of channels (or vaults) which are functionally independent of each other. For example, as illustrated in FIG. 17, the stack-type memory device 300 may support 8 channels CH0 to CH7. In the case where each of the channels CH0 to CH7 supports 128 data transfer paths (DQ I/Os), the stack-type memory device 300 may support 1204 DQ I/Os. However, the disclosure is not limited thereto. For example, the stack-type memory device 300 may support 1024 or more DQ I/Os and may support 8 or more channels (e.g., 16 channels). In the case where the stack-type memory device 300 supports 16 channels, each of the channels may support 64 DQ I/Os.

Each of the core dies 320 to 350 may support at least one channel. For example, as illustrated in FIG. 17, the core die 320 may support 2 channels CH0 and CH2, the core die 330 may support 2 channels CH1 and CH3, the core die 340 may support 2 channels CH4 and CH6, and the core die 350 may support 2 channels CH5 and CH7. In this case, the core dies 320 to 350 may support different channels. However, the disclosure is not limited thereto. For example, at least two of the core dies 320 to 350 may support the same channel. For example, each of the core dies 320 to 350 may support the first channel CH0.

Each channel may constitute an independent command and data interface. For example, each channel may be independently clocked based on independent timing requirements, and the channels may not be synchronized with each other. For example, based on an independent command, each channel may change a power state or may perform a refresh operation.

Each channel may include a plurality of memory banks 301. Each of the memory banks 301 may include memory cells connected to word lines and bit lines, a row decoder, a column decoder, a sense amplifier, etc. For example, as illustrated in FIG. 17, each of the channels CH0 to CH7 may include 8 memory banks 301. However, the disclosure is not limited thereto. For example, each of the channels CH0 to CH7 may include 8 or more memory banks 301. An example in which memory banks included in one channel are included in one core die is illustrated in FIG. 17, but memory banks included in one channel may be distributed into a plurality of core dies. In an example case in which each of the core dies 320 to 350 supports the first channel CH0, memory banks included in the first channel CH0 may be distributed into the core dies 320 to 350.

In an embodiment, one channel may be divided into two pseudo channels operating independently of each other. For example, the pseudo channels may share a command and clock inputs (e.g., the clock signal CK and a clock enable signal CKE) but may independently decode and execute commands. In an example case in which one channel supports 128 DQ IOs, each pseudo channel may support 64 DQ I/Os. In an example case in which one channel supports 64 DQ IOs, each pseudo channel may support 32 DQ I/Os.

Each of the buffer die 310 and the core dies 320 to 350 may include a TSV area 302. TSVs configured to penetrate the dies 310 to 350 may be disposed in the TSV area 302. The buffer die 310 may exchange signals and/or data with the core dies 320 to 350 through the TSVs. Each of the core dies 320 to 350 may exchange signals and/or data with the buffer die 310 and any other core die through the TSVs. In this case, the signals and/or data may be transmitted/received independently through the TSVs for each channel. In an example case in which an external host device transmits a command and an address to the first channel CH0 to access a memory cell of the first core die 310, through the TSVs corresponding to the first channel CH0, the buffer die 310 may transmit control signals to the first core die 320 and may access the memory cell of the first core die 320.

The buffer die 310 may include a physical layer (PHY) 311. The physical layer 311 may include interface circuits for communication with the external host device. For example, the physical layer 311 may include components corresponding to the interface circuit 210 described with reference to FIGS. 1 to 16. The signals and/or the data received through the physical layer 311 may be transmitted to the core dies 320 to 350 through the TSVs.

In an embodiment, the buffer die 310 may include a channel controller corresponding to each channel. The channel controller may manage memory reference operations of the corresponding channel and may determine a timing requirement condition of the corresponding channel.

In an embodiment, the buffer die 310 may include a plurality of pins for receiving signals from the external host device. Through the plurality of pins, the buffer die 310 may receive the clock signal CK, the command/address signal C/A, the write clock WCK, and the data signal DQ and may transmit the read data strobe signal RDQS and the data signal DQ. For example, the buffer die 310 may include 2 pins for the clock signal CK, 14 pins for receiving the command/address signal C/A, 8 pins for receiving the write clock WCK, 8 pins for transmitting the read data strobe signal RDQS, and 128 pins for transmitting/receiving the data signal DQ, for each channel.

Figure 18:
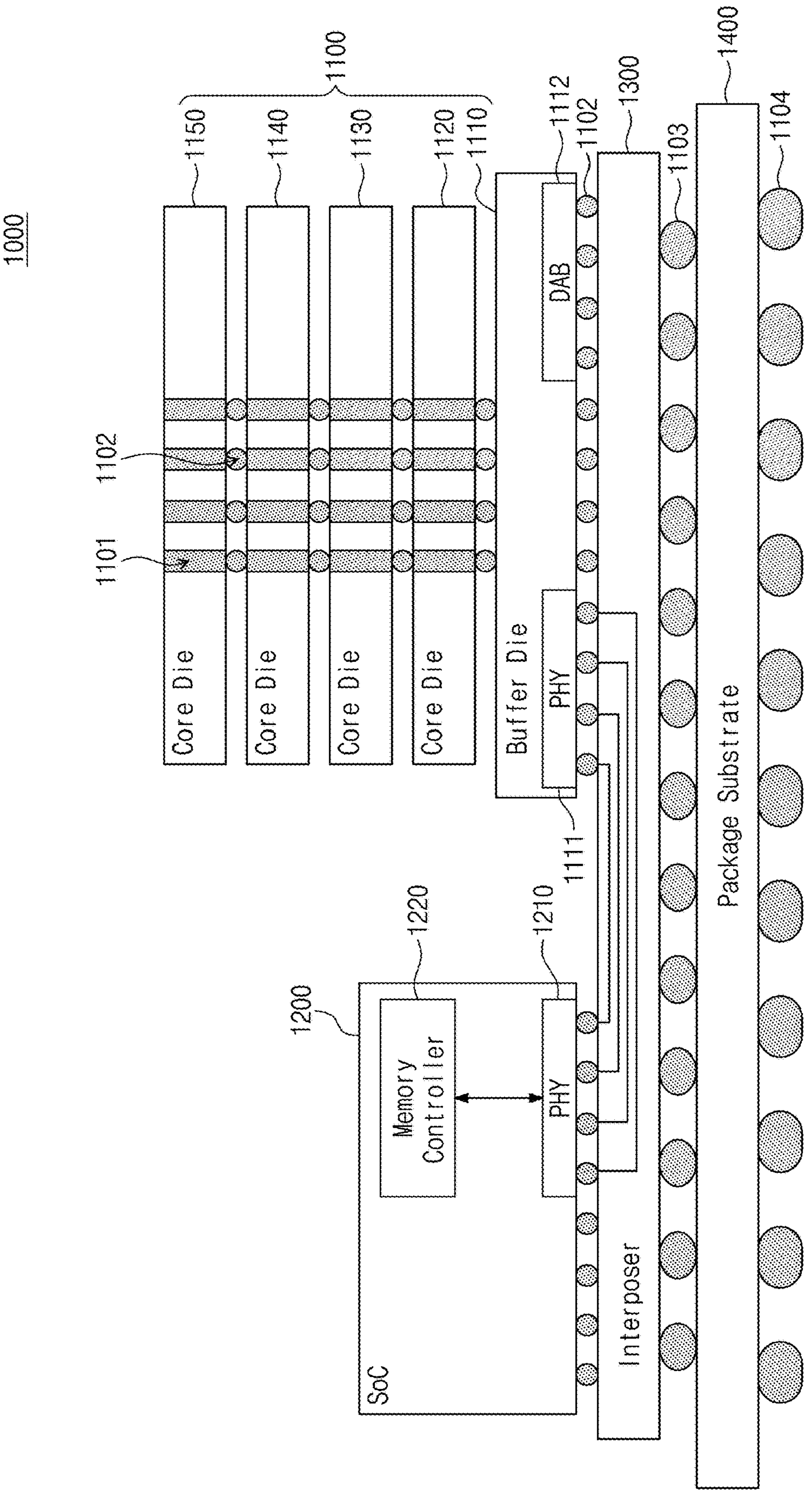
FIG. 18 is a diagram a diagram illustrating a semiconductor package according to an embodiment of the disclosure.

FIG. 18 is a diagram a diagram illustrating a semiconductor package according to an embodiment of the disclosure. Referring to FIG. 18, a semiconductor package 1000 may include a stack-type memory device 1100, a system on chip 1200, an interposer 1300, and a package substrate 1400. The stack-type memory device 1100 may include a buffer die 1110 and core dies 1120 to 1150. The buffer die 1110 may correspond to the buffer die 310 of FIG. 17, and the core dies 1120 to 1150 may respectively correspond to the core dies 320 to 350 of FIG. 17.

Each of the core dies 1120 to 1150 may include a memory cell array. The buffer die 1110 may include a physical layer 1111 and a direct access area 1112. The physical layer 1111 may be electrically connected to a physical layer 1210 of the system on chip 1200 through the interposer 1300. Through the physical layer 1111, the stack-type memory device 1100 may receive signals from the system on chip 1200 or may transmit signals to the system on chip 1200. The physical layer 1111 may include the interface circuits of the buffer die 310 described with reference to FIG. 17.

The direct access area 1112 may provide an access path capable of testing the stack-type memory device 1100 without passing through the system on chip 1200. The direct access area 1112 may include a conductive means (e.g., a port or a pin) capable of directly communicating with an external test device. A test signal and data received through the direct access area 1112 may be transmitted to the core dies 1120 to 1150 through the TSVs. To test the core dies 1120 to 1150, the data read from the core dies 1120 to 1150 may be transmitted to the test device through the TSVs and the direct access area 1112. Accordingly, a direct access test for the core dies 1120 to 1150 may be performed.

The buffer die 1110 and the core dies 1120 to 1150 may be electrically connected to each other by using TSVs 1101 and bumps 1102. The buffer die 1110 may receive signals provided from the system on chip 1200 to each channel through the bumps 1102 allocated for each channel. For example, the bumps 1102 may be micro bumps.

The system on chip 1200 may execute applications, which the semiconductor package 1000 supports, by using the stack-type memory device 1100. For example, the system on chip 1200 may include at least one of a central processing unit (CPU), an application processor (AP), a graphic processing unit (GPU), a neural processing unit (NPU), a tensor processing unit (TPU), a vision processing unit (VPU), an image signal processor (ISP), and a digital signal processor (DSP) and may execute specialized operations.

The system on chip 1200 may include the physical layer 1210 and a memory controller 1220. The physical layer 1210 may include input/output circuits for exchanging signals with the physical layer 1111 of the stack-type memory device 1100. The system on chip 1200 may provide various signals to the physical layer 1111 through the physical layer 1210. The signals provided to the physical layer 1111 may be transmitted to the core dies 1120 to 1150 through the interface circuits of the physical layer 1111 and the TSVs 1101.

The memory controller 1220 may control all the operations of the stack-type memory device 1100. The memory controller 1220 may provide the stack-type memory device 1100 with signals for controlling the stack-type memory device 1100, through the physical layer 1210. The memory controller 1220 may correspond to the memory controller 100 of FIG. 1.

The interposer 1300 may connect the stack-type memory device 1100 and the system on chip 1200. The interposer 1300 may connect the physical layer 1111 of the stack-type memory device 1100 and the physical layer 1210 of the system on chip 1200 and may provide physical paths formed by using conductive materials. Accordingly, the stack-type memory device 1100 and the system on chip 1200 may be stacked on the interposer 1300 and may exchange signals with each other.

Bumps 1103 may be attached on an upper surface of the package substrate 1400, and solder balls 1104 may be attached on a lower surface of the package substrate 1400. For example, the bumps 1103 may be flip-chip bumps. The interposer 1300 may be stacked on the package substrate 1400 through the bumps 1103. The semiconductor package 1000 may exchange signals with external other packages or semiconductor devices through the solder balls 1104. For example, the package substrate 1400 may be a printed circuit board (PCB).

Figure 19:
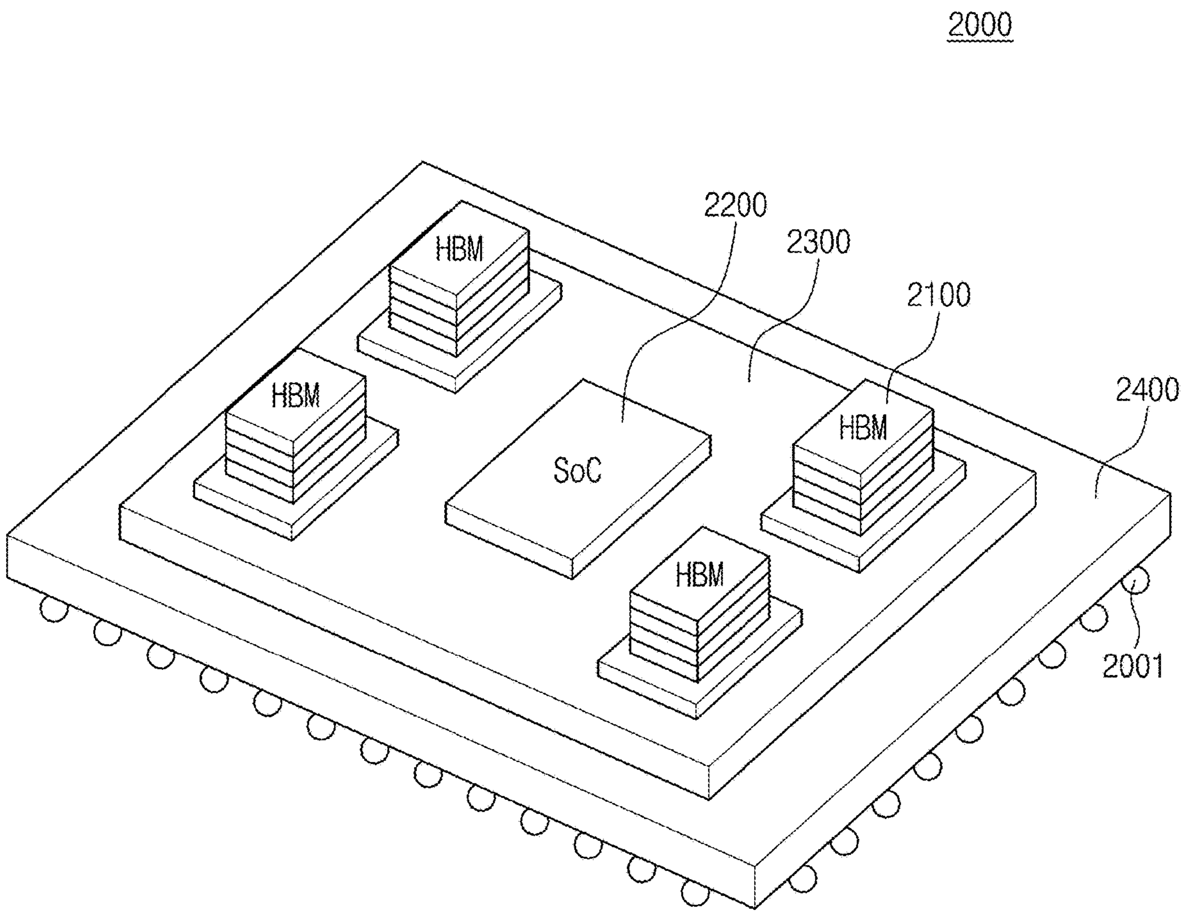
FIG. 19 is a diagram illustrating an implementation example of a semiconductor package according to an embodiment of the disclosure.

FIG. 19 is a diagram illustrating an implementation example of a semiconductor package according to an embodiment of the disclosure. A semiconductor package 2000 may include a plurality of stack-type memory devices 2100 and a system on chip 2200. The stack-type memory devices 2100 and the system on chip 2200 may be stacked on an interposer 2300, and the interposer 2300 may be stacked on a package substrate 2400. The semiconductor package 2000 may exchange signals with external other packages or semiconductor devices through solder balls 2001 attached on a lower surface of the package substrate 2400.

Each of the stack-type memory devices 2100 may be implemented in compliance with the HBM standard. However, the disclosure is not limited thereto. For example, each of the stack-type memory devices 2100 may be implemented based on the GDDR, HMC, or wide I/O standard. Each of the stack-type memory devices 2100 may correspond to the stack-type memory device 300 of FIG. 17 or the stack-type memory device 1100 of FIG. 18.

The system on chip 2200 may include at least one processor, such as a CPU, an AP, a GPU, or an NPU, and a plurality of memory controllers for controlling the plurality of stack-type memory devices 2100. The system on chip 2200 may exchange signals with the corresponding stack-type memory device through a memory controller. The system on chip 2200 may correspond to the system-on-chip 1200 of FIG. 18.

Figure 20:
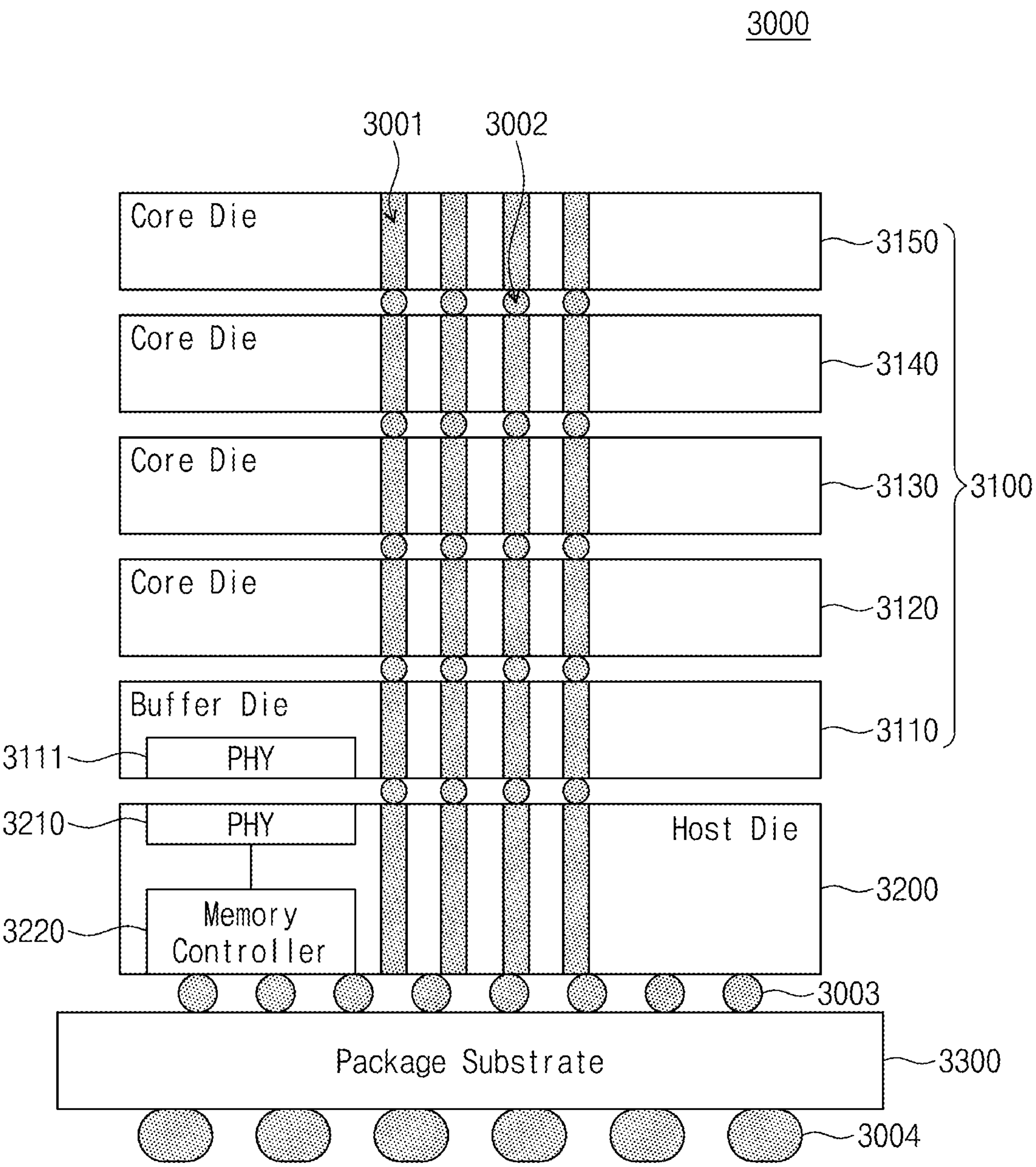
FIG. 20 is a diagram illustrating a semiconductor package according to another embodiment of the disclosure.

FIG. 20 is a diagram illustrating a semiconductor package according to another embodiment of the disclosure. A semiconductor package 3000 may include a stack-type memory device 3100, a host die 3200, and a package substrate 3300. The stack-type memory device 3100 may include a buffer die 3110 and core dies 3120 to 3150. The buffer die 3110 may include a physical layer 3111 for communicating with the host die 3200, and each of the core dies 3120 to 3150 may include a memory cell array. The stack-type memory device 3100 may correspond to the stack-type memory device 300 of FIG. 17.

The host die 3200 may include a physical layer 3210 for communicating with the stack-type memory device 3100 and a memory controller 3220 for controlling all the operations of the stack-type memory device 3100. Also, the host die 3200 may control all the operations of the semiconductor package 3000 and may include a processor for executing an application which the semiconductor package 3000 supports. For example, the host die 3200 may include at least one processor such as a CPU, an AP, a GPU, or an NPU.

The stack-type memory device 3100 may be disposed on the host die 3200 based on TSVs 3001 so as to be vertically stacked on the host die 3200. Accordingly, the buffer die 3110, the core dies 3120 to 3150, and the host die 3200 may be electrically connected to each other through the TSVs 3001 and bumps 3002 without an interposer. For example, the bumps 3002 may be micro bumps.

Bumps 3003 may be attached on an upper surface of the package substrate 3300, and solder balls 3004 may be attached on a lower surface of the package substrate 3300. For example, the bumps 3003 may be flip-chip bumps. The host die 3200 may be stacked on the package substrate 3300 through the bumps 3003. The semiconductor package 3000 may exchange signal with external other packages or semiconductor devices through the solder balls 3004.

In another embodiment, the stack-type memory device 3100 may be implemented only with the core dies 3120 to 3150 without the buffer die 3110. In this case, each of the core dies 3120 to 3150 may include interface circuits for communicating with the host die 3200 as described with reference to FIGS. 1 to 17. Each of the core dies 3120 to 3150 may exchange signals with the host die 3200 through the TSVs 3001.

Figure 21:
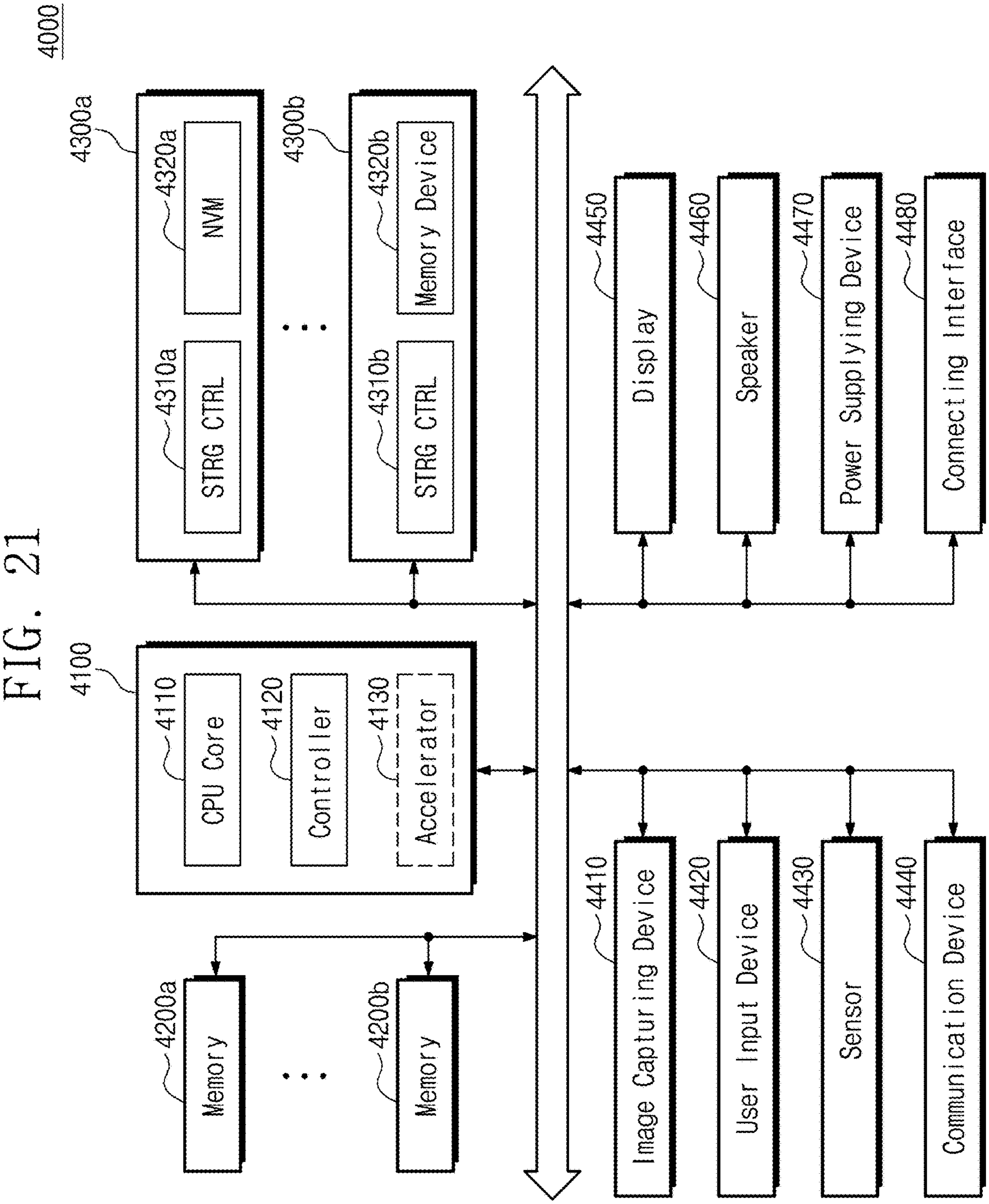
FIG. 21 is a diagram illustrating a system to which a memory device according to an embodiment of the disclosure is applied.

FIG. 21 is a diagram of a system 4000 to which a storage device is applied, according to an embodiment. The system 4000 of FIG. 21 may basically be a mobile system, such as a portable communication terminal (e.g., a mobile phone), a smartphone, a tablet personal computer (PC), a wearable device, a healthcare device, or an Internet of things (IOT) device. However, the system 4000 of FIG. 21 is not necessarily limited to the mobile system and may be a PC, a laptop computer, a server, a media player, or an automotive device (e.g., a navigation device).

Referring to FIG. 21, the system 4000 may include a main processor 4100, memories (e.g., **4200*a* and 4200*b*), and storage devices (e.g., 4300*a* and 4300*b*). In addition, the system 4000 may include at least one of an image capturing device 4410, a user input device 4420, a sensor 4430, a communication device 4440, a display 4450, a speaker 4460, a power supplying device 4470, and a connecting interface 4480**.

The main processor 4100 may control all operations of the system 4000, more specifically, operations of other components included in the system 4000. The main processor 4100 may be implemented as a general-purpose processor, a dedicated processor, or an application processor.

The main processor 4100 may include at least one CPU core 4110 and further include a controller 4120 configured to control the memories **4200*a* and 4200*b* and/or the storage devices 4300*a* and 4300*b*. In some embodiments, the main processor 4100 may further include an accelerator 4130, which is a dedicated circuit for a high-speed data operation, such as an artificial intelligence (AI) data operation. The accelerator 4130 may include a graphics processing unit (GPU), a neural processing unit (NPU) and/or a data processing unit (DPU) and be implemented as a chip that is physically separate from the other components of the main processor 4100**.

The memories **4200*a* and 4200*b* may be used as main memory devices of the system 4000. Although each of the memories 4200*a* and 4200*b* may include a volatile memory, such as static random access memory (SRAM) and/or dynamic RAM (DRAM), each of the memories 4200*a* and 4200*b* may include non-volatile memory, such as a flash memory, phase-change RAM (PRAM) and/or resistive RAM (RRAM). The memories 4200*a* and 4200*b* may be implemented in the same package as the main processor 4100**.

The storage devices **4300*a* and 4300*b* may serve as non-volatile storage devices configured to store data regardless of whether power is supplied thereto, and have larger storage capacity than the memories 4200*a* and 4200*b*. The storage devices 4300***a* and 4300*b* may respectively include storage controllers (STRG CTRL) 4310*a* and 4310*b* and NVM (Non-Volatile Memory) s 4320*a* and 4320*b* configured to store data via the control of the storage controllers 4310*a* and 4310*b*. Although the NVMs 4320*a* and 4320*b* may include flash memories having a two-dimensional (2D) structure or a three-dimensional (3D) V-NAND structure, the NVMs 4320*a* and 4320*b* may include other types of NVMs, such as PRAM and/or RRAM.

The storage devices 4300*a* and 4300*b* may be physically separated from the main processor 4100 and included in the system 4000 or implemented in the same package as the main processor 4100. In addition, the storage devices 4300*a* and 4300*b* may have types of solid-state devices (SSDs) or memory cards and be removably combined with other components of the system 4000 through an interface, such as the connecting interface 4480 that will be described below. The storage devices 4300*a* and 4300*b* may be devices to which a standard protocol, such as a universal flash storage (UFS), an embedded multi-media card (eMMC), or a non-volatile memory express (NVMe), is applied, without being limited thereto.

The image capturing device 4410 may capture still images or moving images. The image capturing device 4410 may include a camera, a camcorder, and/or a webcam.

The user input device 4420 may receive various types of data input by a user of the system 1000 and include a touch pad, a keypad, a keyboard, a mouse, and/or a microphone.

The sensor 4430 may detect various types of physical quantities, which may be obtained from the outside of the system 4000, and convert the detected physical quantities into electric signals. The sensor 4430 may include a temperature sensor, a pressure sensor, an illuminance sensor, a position sensor, an acceleration sensor, a biosensor, and/or a gyroscope sensor.

The communication device 4440 may transmit and receive signals between other devices outside the system 4000 according to various communication protocols. The communication device 4440 may include an antenna, a transceiver, and/or a modem.

The display 4450 and the speaker 4460 may serve as output devices configured to respectively output visual information and auditory information to the user of the system 4000.

The power supplying device 4470 may appropriately convert power supplied from a battery embedded in the system 4000 and/or an external power source, and supply the converted power to each of components of the system 4000.

The connecting interface 4480 may provide connection between the system 4000 and an external device, which is connected to the system 4000 and capable of transmitting and receiving data to and from the system 4000. The connecting interface 4480 may be implemented by using various interface schemes, such as advanced technology attachment (ATA), serial ATA (SATA), external SATA (e-SATA), small computer system interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

According to embodiments of the disclosure, a write clock bias generator capable of compensating for a change of a threshold voltage of a transistor due to a change of a temperature and a memory device including the same may be provided.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A write clock bias generator for providing a write clock bias to a first buffer, the write clock bias generator comprising:

a voltage regulator configured to receive a reference voltage and to output a feedback voltage;

a resistor string comprising a first end connected to a first node and a second end connected to a second node, the feedback voltage being output at the first node;

a multiplexer configured to perform a switching operation corresponding to the resistor string and output the write clock bias based on the switching operation; and a compensation circuit connected to the second node, the compensation circuit comprising:

a first string comprising a first transistor including a first drain electrode and a first gate electrode, the first drain electrode and the first gate electrode being connected to the second node; and a second string comprising a second transistor including a second drain electrode connected to the second node, and a third transistor including a third drain electrode and a third gate electrode, the third drain electrode and the third gate electrode being connected to a second source electrode of the second transistor, the second transistor being driven based on the feedback voltage.

2. The write clock bias generator of claim 1, wherein the voltage regulator comprises:

an error amplifier configured to receive the reference voltage and the feedback voltage;

a pass transistor configured to be driven based on an output of the error amplifier; and a feedback resistor connected between the pass transistor and the first node.

3. The write clock bias generator of claim 1, wherein the first string further comprises a fourth transistor including a fourth drain electrode and a fourth gate electrode which are connected to a first source electrode of the first transistor.

4. The write clock bias generator of claim 1, wherein the compensation circuit further comprises a third string including a resistor.

5. The write clock bias generator of claim 1, further comprising:

a second buffer being identical in structure to the first buffer;

a comparator configured to:

compare an output voltage of the second buffer and a reference voltage, and output a comparison result based on the comparison between the output voltage of the second buffer and the reference voltage; and a counter configured to perform a counting operation based on the comparison result and output a counting value based on the counting operation, wherein the multiplexer is further configured to perform the switching operation based on the counting value of the counter.

6. The write clock bias generator of claim 5, wherein the resistor string comprises a plurality of resistors, and wherein the multiplexer comprises:

a plurality of switches, each of the plurality of switches being respectively connected to one of a plurality of nodes of the resistor string; and a decoder configured to generate a plurality of signals for controlling the plurality of switches based on the counting value of the counter.

7. The write clock bias generator of claim 5, wherein the second buffer comprises:

a first load resistor including a first end connected to a power supply voltage;

a first NMOS transistor including a first end connected to a second end of the first load resistor;

a second load resistor including a first end connected to the power supply voltage;

a second NMOS transistor including a first end connected to a second end of the second load resistor; and a third NMOS transistor including a first end connected to a second end of the first NMOS transistor and a second end of the second NMOS transistor, the third NMOS transistor being driven based on the write clock bias, and wherein the output voltage of the second buffer is output from a node between the second load resistor and the second NMOS transistor.

8. The write clock bias generator of claim 5, wherein, based on the output voltage toggling a reference number of times, the write clock bias is determined as being locked.

9. The write clock bias generator of claim 5, wherein, based on an internal clock used by the counter toggling a reference number of times, it the write clock bias is determined as being locked.

10. A memory device comprising:

a buffer die configured to communicate with a memory controller through a plurality of channels; and a plurality of core dies provided on the buffer die, each of the plurality of core dies comprising a memory cell array corresponding to at least one of the plurality of channels, wherein the buffer die comprises:

a command/address receiver configured to receive a command and an address based on a clock signal received from at least one of the plurality of channels;

a write clock buffer configured to receive a write clock through at least one of the plurality of channels; and a write clock bias generator configured to provide a write clock bias to the write clock buffer, the write clock bias generator comprising:

a voltage regulator configured to output a feedback voltage;

a resistor string and a multiplexer configured to output the write clock bias based on the feedback voltage;

a first string connected to the resistor string and including a first transistor; and a second string connected to the resistor string and including a second transistor driven based on the feedback voltage and a third transistor, wherein the first transistor and the third transistor are diode-connected transistors.

11. The memory device of claim 10, wherein the voltage regulator comprises:

an error amplifier configured to receive a reference voltage and the feedback voltage;

a pass transistor configured to be driven based on an output of the error amplifier; and a feedback resistor connected between the pass transistor and a first node from which the feedback voltage is output.

12. The memory device of claim 10, wherein the first string further includes a fourth transistor, which is a diode-connected transistor.

13. The memory device of claim 10, wherein the write clock bias generator further comprises a third string connected to the resistor string and including a resistor.

14. The memory device of claim 10, further comprising:

a replica buffer being identical in structure to the write clock buffer;

a comparator configured to:

compare an output voltage of the replica buffer and a reference voltage, and output a comparison result based on the comparison between the output voltage of the replica buffer and the reference voltage; and a counter configured to perform counting based on the comparison result to output a counting value.

15. The memory device of claim 14, wherein the resistor string comprises a plurality of resistors, and wherein the multiplexer comprises:

a plurality of switches, each of the plurality of switches being connected to one of a plurality of nodes of the resistor string; and a decoder configured to generate a plurality of signals for controlling the plurality of switches based on the counting value of the counter.

16. The memory device of claim 14, wherein the replica buffer includes:

a first load resistor including a first end connected to a power supply voltage;

a first NMOS transistor including a first end connected to a second end of the first load resistor;

a second load resistor including a first end connected to the power supply voltage;

a second NMOS transistor including a first end connected to a second end of the second load resistor; and a third NMOS transistor including a first end connected to a second end of the first NMOS transistor and a second end of the second NMOS transistor, the third NMOS transistor being driven by the write clock bias, and wherein the output voltage of the replica buffer is output from a node between the second load resistor and the second NMOS transistor.

17. A write clock bias generator comprising:

a voltage regulator configured to receive a reference voltage and to output a feedback voltage;

a voltage division circuit configured to output a write clock bias based on the feedback voltage, the write clock bias varying based on a temperature change; and a compensation circuit connected to the voltage division circuit, the compensation circuit comprising:

a first string connected to the voltage division circuit and including a first transistor; and a second string connected to the voltage division circuit and including a second transistor driven based on the feedback voltage and a third transistor, wherein the first transistor and the third transistor are diode-connected transistors.

18. The write clock bias generator of claim 17, wherein the first string further includes a fourth transistor including a drain electrode and a gate electrode which are connected to a source electrode of the first transistor.

19. The write clock bias generator of claim 17, wherein the compensation circuit further includes a third string connected to the voltage division circuit and including a resistor.

20. The write clock bias generator of claim 17, further comprising:

a replica buffer configured to output a replica current;

a comparator configured to:

compare an output voltage of the replica buffer and a reference voltage, and output a comparison result based on the comparison between the output voltage of the replica buffer and a reference voltage; and a counter configured to perform counting based on the comparison result and output a counting result, wherein the voltage division circuit is configured to adjust a level of the write clock bias based on the counting result of the counter.

* * * * *